US012690290B2

(12) United States Patent
Horiguchi et al.

(10) Patent No.: US 12,690,290 B2
(45) Date of Patent: Jul. 21, 2026

(54) PHOTOELECTRIC CONVERSION ELEMENT, METHOD FOR MANUFACTURING PHOTOELECTRIC CONVERSION ELEMENT, SOLAR CELL MODULE, AND PADDLE

(71) Applicant: IDEMITSU KOSAN CO., LTD., Tokyo (JP)

(72) Inventors: Kyohei Horiguchi, Tokyo (JP); Mikio Hamano, Tokyo (JP); Yoshihide Miyagawa, Tokyo (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 127 days.

(21) Appl. No.: 18/568,268

(22) PCT Filed: Jun. 9, 2022

(86) PCT No.: PCT/JP2022/023338
§ 371 (c)(1),
(2) Date: Dec. 7, 2023

(87) PCT Pub. No.: WO2022/260140
PCT Pub. Date: Dec. 15, 2022

(65) Prior Publication Data
US 2024/0274730 A1 Aug. 15, 2024

(30) Foreign Application Priority Data
Jun. 10, 2021 (JP) .................................. 2021-097294

(51) Int. Cl.
*H10F 77/20* (2025.01)
*H10F 71/00* (2025.01)
(52) U.S. Cl.
CPC ....... *H10F 77/211* (2025.01); *H10F 71/1385* (2025.01)

(58) Field of Classification Search
CPC .. H10F 77/211; H10F 71/1385; H10F 10/167; H10F 19/90; H10F 77/126; Y02E 10/541
See application file for complete search history.

(56) References Cited

U.S. PATENT DOCUMENTS

| | | | |
|---|---|---|---|
| 5,259,891 A | 11/1993 | Matsuyama et al. | |
| 2008/0202584 A1 | 8/2008 | Basol | |

(Continued)

FOREIGN PATENT DOCUMENTS

| | | |
|---|---|---|
| JP | H04-276665 A | 10/1992 |
| JP | H09-237911 A | 9/1997 |

(Continued)

OTHER PUBLICATIONS

English machine translation of JP-2021057499-A (Year: 2021).*

(Continued)

*Primary Examiner* — Angelo Trivisonno
(74) *Attorney, Agent, or Firm* — Foley & Lardner LLP

(57) ABSTRACT

A photoelectric conversion element includes: a back electrode layer formed on a substrate; a photoelectric conversion layer facing a light receiving surface side of the back electrode layer and containing a chalcogen semiconductor; and a current collector electrically connected to the light receiving surface side of the photoelectric conversion layer, in which a first region including an interface between the back electrode layer and the photoelectric conversion layer and a second region not including an interface between the back electrode layer and the photoelectric conversion layer are provided on the substrate, and a joined portion between the current collector and a wiring member is formed in the second region.

11 Claims, 12 Drawing Sheets

(56)          References Cited

U.S. PATENT DOCUMENTS

2016/0126379 A1      5/2016   Jun
2020/0373447 A1*   11/2020   Hilali ...................... H01L 21/50

FOREIGN PATENT DOCUMENTS

JP          2010-199173  A      9/2010
JP          2016-521015  A      7/2016
JP          2017-143105  A      8/2017
JP            2021057499  A   *   4/2021
WO     WO-2010109567  A1  *   9/2010   ........... H10F 10/174

OTHER PUBLICATIONS

English machine translation of WO-2010109567-A1 (Year: 2010).*
International Searching Authority, "International Search Report,"
issued in connection with International Patent Application No.
PCT/JP2022/023338, dated Sep. 6, 2022.
International Searching Authority, "Written Opinion," issued in
connection with International Patent Application No. PCT/JP2022/
023338, dated Sep. 6, 2022.
Granata et al.: "AFRL Thin Film Solar Cell Development and
Upcoming Flight Experiments" 2005 IEEE Aerospace Conference,
Big Sky, MT, USA, 2005, pp. 1-6.
Office Action issued in corresponding Japanese Patent Application
No. 2023-527929 date Nov. 11, 2025.

* cited by examiner

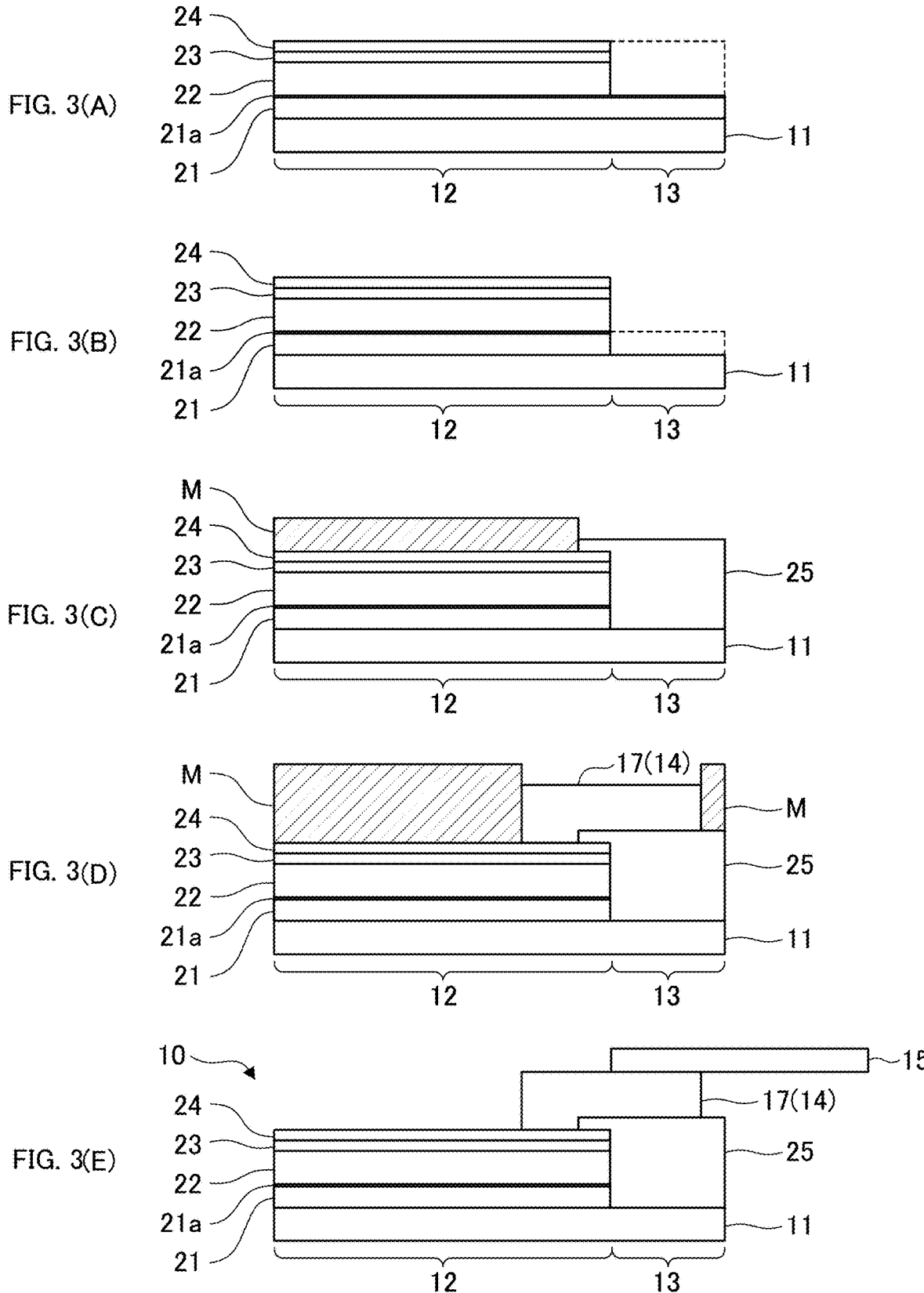

FIG. 4

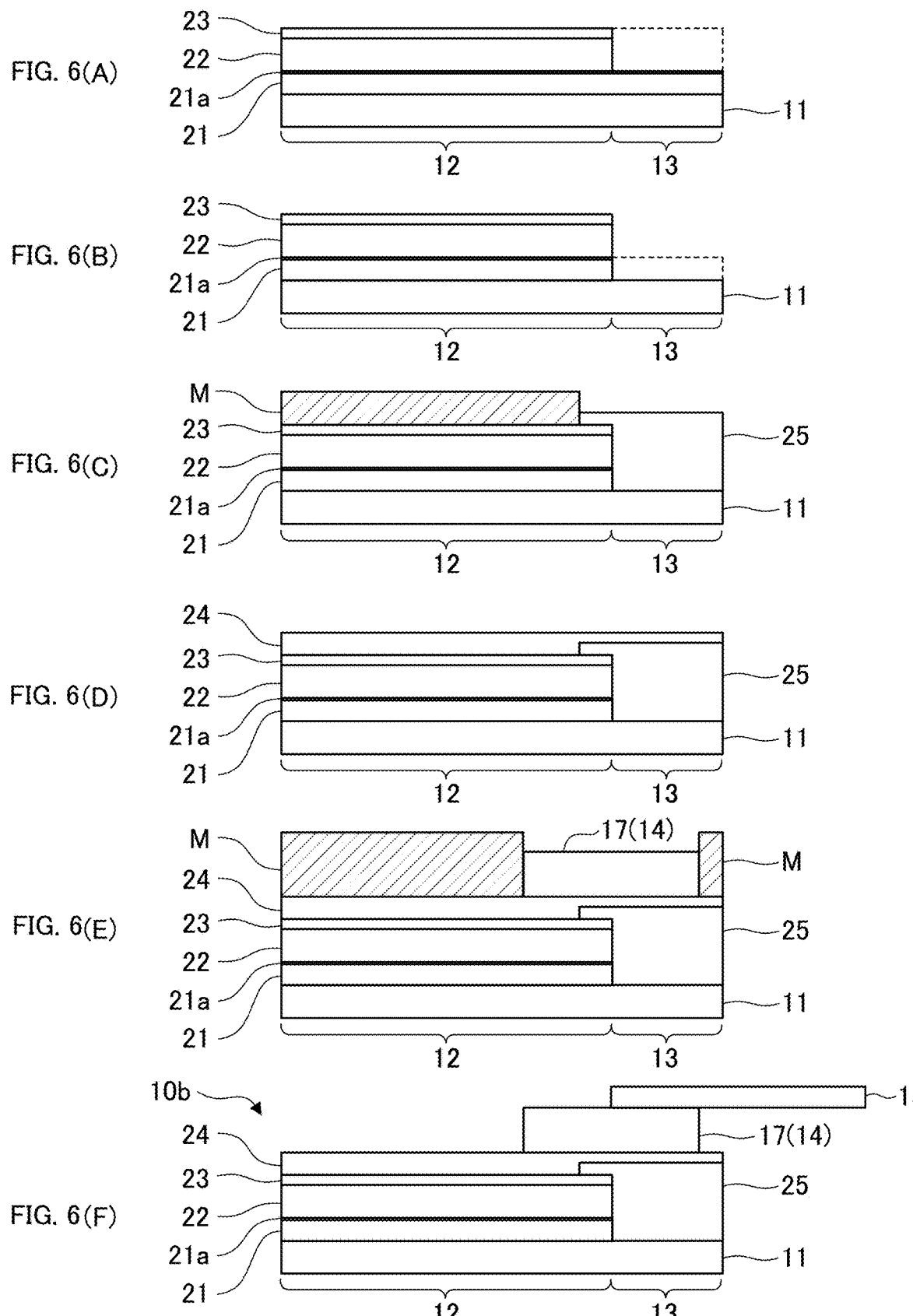

10f 24
23
22
21a
21

17(14)

15

27

11

12          13

10g 24
23
22
21a
21

17(14)

15

27

11

12          13

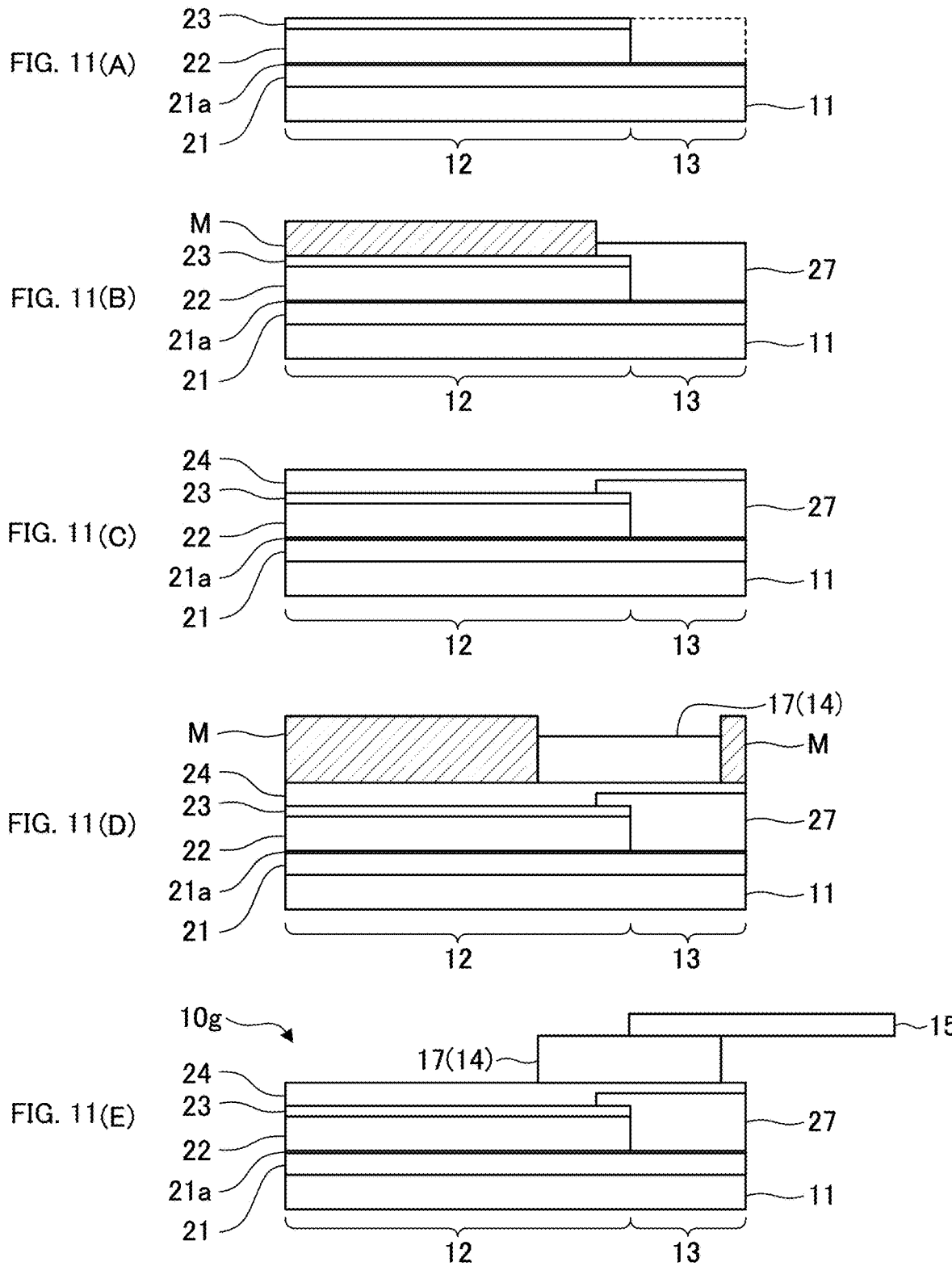

PHOTOELECTRIC CONVERSION ELEMENT, METHOD FOR MANUFACTURING PHOTOELECTRIC CONVERSION ELEMENT, SOLAR CELL MODULE, AND PADDLE

CROSS-REFERENCE TO RELATED APPLICATIONS

The present application claims priority under 35 U.S.C. § 371 to International Patent Application No. PCT/JP2022/023338, filed Jun. 9, 2022, which claims priority to and the benefit of Japanese Patent Application No. 2021-097294, filed on Jun. 10, 2021. The contents of these applications are hereby incorporated by reference in their entireties.

TECHNICAL FIELD

The present invention relates to a photoelectric conversion element, a method for manufacturing the photoelectric conversion element, a solar cell module, and a paddle.

BACKGROUND ART

Conventionally, as one of photoelectric conversion elements, a CIS-based solar cell using a group $I\text{-}III\text{-}VI_2$ compound semiconductor having a chalcopyrite structure containing Cu, In, Ga, Se, and S as a photoelectric conversion layer has been proposed. A CIS-based solar cell is relatively inexpensive to manufacture, and further, has a large absorption coefficient in the visible to near-infrared wavelength range, and thus is expected to have high photoelectric conversion efficiency.

The CIS-based solar cell is configured, for example, by forming a metal back electrode layer on a substrate, forming a photoelectric conversion layer of a chalcogen semiconductor containing a chalcogen element on the back electrode layer, and further forming a buffer layer and a window layer formed of a transparent conductive film in order. In addition, in this type of solar cell, a wiring structure in which extraction wiring (interconnector) is attached onto a solar cell has been conventionally used (see, for example, Patent Literature 1).

CITATION LIST

Patent Literature

Patent Literature 1: JP H9-237911 A

SUMMARY OF INVENTION

Technical Problem

In the wiring structure of the conventional solar cell described above, since an interconnector is attached on an element having the multilayer structure, there are a plurality of interfaces under the wiring. Therefore, in order to increase the adhesion strength of the interconnector, the adhesion strength of each interface is one of the constraint conditions. In particular, in a CIS-based solar cell, since the adhesion strength at the interface between a photoelectric conversion layer and a back electrode layer is lower than the adhesion strength at other interfaces, it is difficult to join a solar cell and the interconnector with high adhesion strength.

The present invention has been made in view of the above circumstances, and provides a photoelectric conversion element including a chalcogen semiconductor in the photoelectric conversion layer and capable of joining the interconnector with higher adhesion strength than before.

Solution to Problem

A photoelectric conversion element according to one aspect of the present invention includes: a back electrode layer formed on a substrate; a photoelectric conversion layer facing a light receiving surface side of the back electrode layer and containing a chalcogen semiconductor; and a current collector electrically connected to the light receiving surface side of the photoelectric conversion layer, in which a first region including an interface between the back electrode layer and the photoelectric conversion layer and a second region not including an interface between the back electrode layer and the photoelectric conversion layer are provided on the substrate, and a joined portion between the current collector and a wiring member is formed in the second region.

Advantageous Effects of Invention

According to the present invention, it is possible to provide a photoelectric conversion element including a chalcogen semiconductor in a photoelectric conversion layer and capable of joining an interconnector with higher adhesion strength than before.

BRIEF DESCRIPTION OF DRAWINGS

FIGS. 3(A)-3(E) are a view schematically illustrating a method for manufacturing the solar cell of FIG. 2(A).

FIG. 4 is a view illustrating an example of a cross-section in a thickness direction of a solar cell of a comparative example.

FIGS. 6(A)-6(F) are a view schematically illustrating a method for manufacturing the solar cell of FIG. 5(A).

FIGS. 11(A)-11(E) are a view schematically illustrating a method for manufacturing the solar cell of FIG. 9(B).

DESCRIPTION OF EMBODIMENTS

Figure 1:
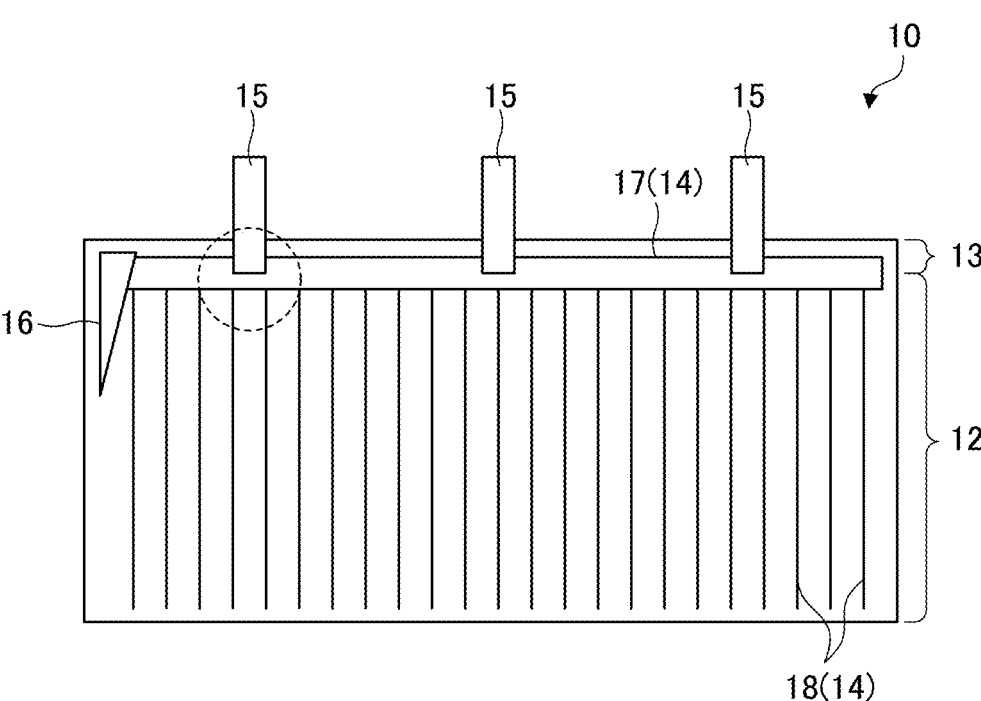
FIG. 1 is a plan view illustrating a configuration example of a solar cell of a first embodiment.

Hereinafter, embodiments of the present invention will be described with reference to the drawings. In the embodiment, as an example of the photoelectric conversion element, a configuration example of a CIS-based solar cell will be mainly described.

In the embodiment, for ease of description, structures or elements other than the main parts of the present invention will be described in a simplified or omitted manner. In the drawings, the same elements are denoted by the same reference numerals. In the drawings, shapes, dimensions, and the like of each element are schematically illustrated, and do not indicate actual shapes, dimensions, and the like.

First Embodiment

Figure 2A:
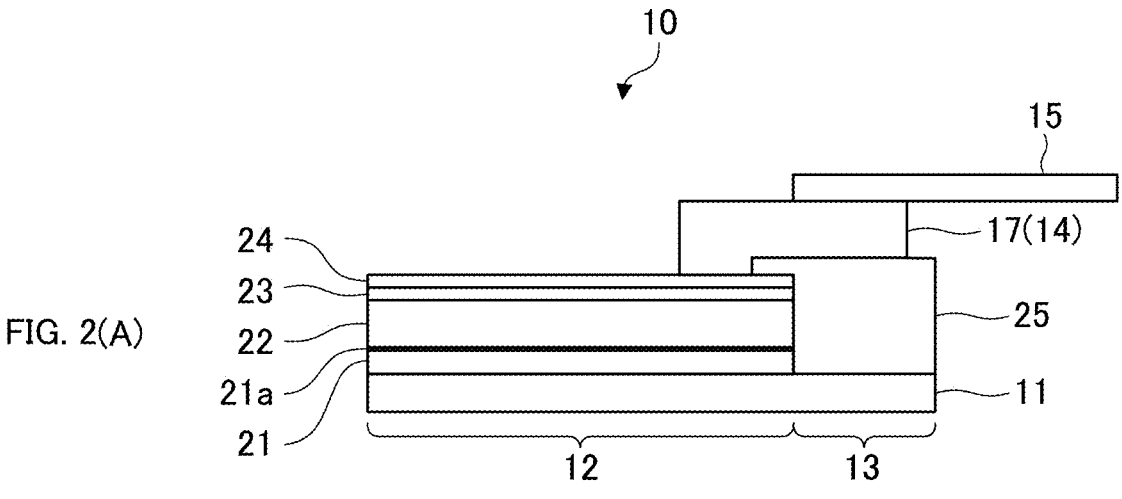
FIG. 2(A) is a view illustrating an example of a cross-section in a thickness direction in the solar cell of the first embodiment.

FIG. 1 is a plan view illustrating a configuration example of a solar cell of a first embodiment. In addition, FIG. 2(A) is a view illustrating an example of a cross-section in a thickness direction of the solar cell of the first embodiment. FIG. 2(A) corresponds to a cross-section of a portion surrounded by a broken line in FIG. 1.

As illustrated in FIGS. 1 and 2(A), a solar cell 10 has a first region 12 that performs photoelectric conversion and a second region 13 that does not contribute to photoelectric conversion and is used as a wiring arrangement region in a planar direction of a light receiving surface.

As illustrated in FIG. 2(A), the first region 12 and the second region 13 are formed on a substrate 11. In addition, as illustrated in FIG. 1, on the light receiving surface of the solar cell 10, a collector electrode 14 as an example of a collector, an interconnector 15 connected to the collector electrode 14, and a bypass diode 16 for bypassing a cell that cannot generate power are disposed. Note that light such as sunlight enters the solar cell 10 from the side opposite to the substrate 11 side (the upper side of FIG. 2(A)).

The substrate 11 can be selected from a glass substrate, a resin substrate, a metal substrate, and the like, and may be a flexible substrate. The shape and dimension of the substrate 11 are appropriately determined according to the size or the like of the solar cell 10. The entire shape of the substrate 11 in the first embodiment is, for example, a rectangular flat plate shape, but is not limited thereto.

When a metal substrate is adopted as the substrate 11, the substrate 11 is formed of, for example, titanium (Ti), stainless steel (SUS), copper, aluminum, an alloy thereof, and the like. Alternatively, the substrate 11 may have a layered structure in which a plurality of metal substrates are stacked, and for example, a stainless foil, a titanium foil, or a molybdenum foil may be formed on the surface of the substrate.

When the substrate 11 is a flexible metal substrate, the solar cell 10 can be bent, and cracking of the substrate 11 due to bending can also be suppressed. Furthermore, in the above case, it is easy to reduce the weight and thickness of the solar cell 10 as compared with the glass substrate.

Next, the configurations of the first region 12 and the second region 13 of the solar cell 10 will be described.

The first region 12 has a layered structure in which a first electrode layer 21, a photoelectric conversion layer 22, a buffer layer 23, and a second electrode layer 24 are sequentially stacked on the substrate 11.

The first electrode layer 21 is, for example, a metal electrode layer of molybdenum (Mo), and is formed on the substrate 11. Since the first electrode layer 21 faces not the light receiving surface side but the back side (substrate side) of the solar cell 10, it is also referred to as a back electrode. Although not particularly limited, the thickness of the first electrode layer 21 is, for example, 50 nm to 1000 nm.

In addition, in the first electrode layer 21, a group VI compound layer 21a made of $Mo(Se, S)_2$ is formed at an interface with the photoelectric conversion layer 22. $Mo(Se, S)_2$ of the group VI compound layer 21a is formed on the surface of the first electrode layer 21 when a precursor layer is chalcogenized to form the photoelectric conversion layer 22 as described later. $Mo(Se, S)_2$ in the group VI compound layer 21a is a substance having a graphite-like multilayer structure, and has a property of being easily peeled off by cleavage between layers.

The photoelectric conversion layer 22 is formed on the first electrode layer 21. The photoelectric conversion layer 22 may have a double graded structure in which the band gap is large on each of the light receiving surface side (upper side in FIGS. 2(A) and 2(B)) and the substrate 11 side (lower side in FIGS. 2(A) and 2(B)) and the band gap is small on the inner side in the thickness direction of the photoelectric conversion layer 22. Although not particularly limited, the thickness of the photoelectric conversion layer 22 is, for example, 1.0 μm to 3.0 μm.

The photoelectric conversion layer 22 is formed of a chalcogen semiconductor containing a chalcogen element, and functions as a polycrystalline or microcrystalline p-type compound semiconductor layer. The photoelectric conversion layer 22 is made of, for example, a group $I-III-VI_2$ compound semiconductor having a chalcopyrite structure containing a group I element, a group III element, and a group VI element (chalcogen element). Here, the group I element can be selected from copper (Cu), silver (Ag), gold (Au), and the like. The group III element can be selected from indium (In), gallium (Ga), aluminum (Al), and the like. In addition, the photoelectric conversion layer 22 may contain tellurium (Te) or the like in addition to selenium (Se) and sulfur (S) as a group VI element. In addition, the photoelectric conversion layer 22 may contain an alkali metal such as Li, Na, K, Rb, or Cs.

The photoelectric conversion layer 22 may be made of a group $I_2-(II-IV)-VI_4$ compound semiconductor which is a CZTS-based chalcogen semiconductor containing Cu, Zn, Sn, S, or Se. Representative examples of the CZTS-based chalcogen semiconductor include those using a compound such as $Cu_2ZnSnSe_4$ or $Cu_2ZnSn(S, Se)_4$.

The buffer layer 23 is formed on the photoelectric conversion layer 22. Although not particularly limited, the thickness of the buffer layer 23 is, for example, 10 nm to 100 nm.

The buffer layer 23 is, for example, an n-type or an i (intrinsic)-type high-resistance conductive layer. Here, the term "high-resistance" means having a resistance value higher than the resistance value of the second electrode layer 24 described later.

The buffer layer 23 can be selected from compounds containing zinc (Zn), cadmium (Cd), and indium (In). Examples of the compound containing zinc include ZnO, ZnS, $Zn(OH)_2$, or Zn(O, S) and Zn(O, S, OH) which are mixed crystals thereof, and further include ZnMgO and ZnSnO. Examples of the compound containing cadmium include CdS, CdO, and Cd(O, S) and Cd(O, S, OH) which are mixed crystals of CdS and CdO. Examples of the compound containing indium include InS, InO, and In(O, S)

and In(O, S, OH) which are mixed crystals of InS and InO, and $In_2O_3$, $In_2S_3$, $In(OH)_x$, and the like can be used. In addition, the buffer layer 23 may have a layered structure of these compounds.

Note that the buffer layer 23 has an effect of improving characteristics such as photoelectric conversion efficiency, but this may be omitted. When the buffer layer 23 is omitted, the second electrode layer 24 is formed on the photoelectric conversion layer 22.

The second electrode layer 24 is formed on the buffer layer 23. The second electrode layer 24 is, for example, an n-type conductive layer. Although not particularly limited, the thickness of the second electrode layer 24 is, for example, 0.5 μm to 2.5 μm.

The second electrode layer 24 preferably includes, for example, a material having a large band gap and a sufficiently low resistance value. In addition, since the second electrode layer 24 serves as a path of light such as sunlight, it is preferable that the second electrode layer 24 has a property of transmitting light having a wavelength that can be absorbed by the photoelectric conversion layer 22. From this point of view, the second electrode layer 24 is also referred to as a transparent electrode layer or a window layer.

The second electrode layer 24 includes, for example, a metal oxide to which a group III element (B, Al, Ga, or In) is added as a dopant. Examples of the metal oxide include ZnO and $SnO_2$. The second electrode layer 24 can be selected from, for example, indium tin oxide ($In_2O_3$: Sn), indium titanium oxide ($In_2O_3$: Ti), indium zinc oxide ($In_2O_3$: Zn), tin zinc doped indium oxide ($In_2O_3$: Sn, Zn), tungsten doped indium oxide ($In_2O_3$: W), hydrogen doped indium oxide ($In_2O_3$: H), indium gallium zinc oxide ($InGaZnO_4$), zinc tin oxide (ZnO: Sn), fluorine doped tin oxide ($SnO_2$: F), gallium doped zinc oxide (ZnO: Ga), boron doped zinc oxide (ZnO: B), aluminum doped zinc oxide (ZnO: Al), and the like.

In addition, the collector electrode 14 is electrically connected to the light receiving surface side of the second electrode layer 24. Since the collector electrode 14 blocks sunlight incident on the photoelectric conversion layer 22, it is preferable to reduce the area as much as possible from the viewpoint of improving power generation efficiency. Therefore, as illustrated in FIG. 1, the collector electrode 14 is configured to have a comb-like overall shape by combining a bus bar electrode 17 and the plurality of finger electrodes 18.

The finger electrodes 18 are long and narrow electrodes extending in the vertical direction in FIG. 1, and are provided in parallel at intervals in the horizontal direction in FIG. 1. Each of the finger electrodes 18 is disposed in the first region 12 of the solar cell 10 and has a function of guiding electricity generated in the photoelectric conversion layer 22 to the bus bar electrode 17.

The bus bar electrode 17 is an electrode extending in the horizontal direction in FIG. 1 and substantially orthogonal to the finger electrodes 18, and is electrically connected to the finger electrodes 18. The bus bar electrode 17 has a function of extracting electricity collected by the finger electrodes 18 to the outside. As illustrated in FIG. 2(A), the bus bar electrode 17 is disposed across the first region 12 to the second region 13.

When the bus bar electrode 17 is electrically connected to the second electrode layer 24 via the finger electrodes 18, the bus bar electrode 17 may be provided only on the second region 13. In this case, the bus bar electrode 17 has no optical loss (shadow loss) that blocks sunlight incident on the photoelectric conversion layer 22, which is preferable from the viewpoint of improving power generation efficiency. In addition, in this case, the finger electrodes 18 can be arranged across the first region 12 to the second region 13.

When the bus bar electrode 17 is disposed up to the boundary with the first region 12 in the second region 13, the area of the bus bar electrode 17 can be increased, so that resistance loss can be reduced. Therefore, there is no shadow loss due to the bus bar electrode 17, and resistance loss can be reduced. In addition, when the bus bar electrode 17 is disposed up to the boundary with the first region 12 in the second region 13, the finger electrodes 18 are disposed up to the boundary with the second region 13 in the first region 12.

For example, as a material of the collector electrode 14, a material that has good conductivity and can obtain high adhesion to the second electrode layer 24 and the insulating layer 25 described later is applied. For example, the material of the collector electrode 14 can be selected from, indium tin oxide ($In_2O_3$: Sn), indium titanium oxide ($In_2O_3$: Ti), indium zinc oxide ($In_2O_3$: Zn), tin zinc doped indium oxide ($In_2O_3$: Sn, Zn), tungsten doped indium oxide ($In_2O_3$: W), hydrogen doped indium oxide ($In_2O_3$: H), indium gallium zinc oxide ($InGaZnO_4$), zinc tin oxide (ZnO: Sn), fluorine doped tin oxide ($SnO_2$: F), aluminum doped zinc oxide (ZnO: Al), boron doped zinc oxide (ZnO: B), gallium doped zinc oxide (ZnO: Ga), Ni, Ti, Cr, Mo, Al, Ag, Cu, compounds containing one or more of these, and the like.

The collector electrode 14 may be a layered product of two or more kinds of metal films or transparent conductive films. Although not particularly limited, the thickness of the collector electrode 14 is, for example, 0.5 μm to 50 μm.

On the other hand, in the second region 13 of the solar cell 10, the first electrode layer 21, the photoelectric conversion layer 22, the buffer layer 23, and the second electrode layer 24 are not provided. Then, on the substrate 11 in the second region 13, an insulating layer 25 is formed instead of the first electrode layer 21, the photoelectric conversion layer 22, the buffer layer 23, and the second electrode layer 24. The insulating layer 25 is formed so as to cover each end surface in the planar direction of the first electrode layer 21, the photoelectric conversion layer 22, the buffer layer 23, and the second electrode layer 24, and partially cover the light receiving surface side of the second electrode layer 24 in the first region 12.

Here, the insulating layer 25 can use a known insulating material applicable to film formation in a semiconductor process, but is preferably formed of an oxide in order to electrically separate the back surface side and the cell end surface from the collector electrode 14. Examples of the material of the insulating layer 25 include $Al_2O_3$, $Y_2O_3$, $ZrO_2$, MgO, $HfO_2$, $Bi_2O_3$, $TiO_2$, ZnO, $In_2O_3$, $SnO_2$, $Nb_2O_5$, $Ta_2O_5$, $SiO_2$, and $Ca_3(PO_4)_2$.

The insulating layer 25 may be a layered product of a plurality of materials described above. Although not particularly limited, the thickness of the insulating layer 25 is, for example, 0.1 μm to 50 μm.

In addition, the bus bar electrode 17 of the collector electrode 14 is stacked on the light receiving surface side of the insulating layer 25. Then, the interconnector 15 is joined to the light receiving surface side of the bus bar electrode 17. The thickness of the collector electrode 14 at the joined portion with the interconnector 15 is preferably 1.0 μm or more.

The interconnector 15 is a wiring member on the negative electrode side of the solar cell 10, and three of the interconnectors 15 are connected in parallel to the upper end of the solar cell 10 in FIG. 1. The interconnector 15 may be, for example, a ribbon wire of a conductive metal including Ag, Ni, Co, Fe, Cr, Mo, Mn, Cu, Al, Ti, or a combination thereof. In addition, the interconnector 15 may be made of an alloy containing some of the above-described conductive metals, such as an alloy Kovar or stainless steel (SUS). Although not particularly limited, the dimensions of the interconnector 15 can be a strip shape having a thickness of about 30 μm and a width of about 2.5 mm. In addition, the interconnector 15 may not have a strip shape, but may have a single piece configuration that continuously covers the bus bar 17.

In the first embodiment, the description of the wiring on the positive electrode side of the solar cell 10 is omitted.

The interconnectors 15 and the bus bar electrode 17 are joined by, for example, parallel gap resistance welding. In addition, as illustrated in FIG. 2(A), the joined portion of the interconnectors 15 is at a position overlapping the second region 13 in the planar direction, and is shifted from the first region 12. A portion that is not a joined portion of the interconnector 15 (for example, a portion not welded and joined) may be provided on the first region 12.

Next, a method for manufacturing the solar cell of the first embodiment will be described. FIGS. 3(A)-3(E) are a view schematically illustrating a method for manufacturing the solar cell 10 of FIG. 2(A).

(I-1) Preparation of Solar Cell

First, a solar cell in which the first electrode layer 21, the photoelectric conversion layer 22, the buffer layer 23, and the second electrode layer 24 are sequentially formed on a substrate is prepared by the following steps.

The first electrode layer 21 is formed by forming a thin film of molybdenum (Mo) or the like on the surface of the substrate 11 by, for example, a sputtering method. The sputtering method may be a direct current (DC) sputtering method or a radio frequency (RF) sputtering method. In addition, the first electrode layer 21 may be formed using a chemical vapor deposition (CVD) method, an atomic layer deposition (ALD) method, or the like instead of the sputtering method.

The photoelectric conversion layer 22 is formed by forming a thin film precursor layer on the first electrode layer 21 and chalcogenizing the precursor layer.

Examples of the method for forming the precursor layer on the first electrode layer 21 include the sputtering method, the vapor deposition method, and the ink coating method. The vapor deposition method is a method of forming a film by heating a vapor deposition source and using an atom or the like that has become a gas phase. The ink coating method is a method in which a powdered precursor film material is dispersed in a solvent such as an organic solvent and applied onto the first electrode layer 21, and then the solvent is evaporated to form a precursor layer.

When the CIS-based photoelectric conversion layer 22 is formed, the precursor layer contains the group I element and the group III element. For example, the precursor layer may contain Ag as the group I element. The group I elements other than Ag included in the precursor layer can be selected from copper, gold, and the like. In addition, the group III element included in the precursor layer can be selected from indium, gallium, aluminum, and the like. In addition, the precursor layer may contain an alkali metal such as Li, Na, K, Rb, or Cs. In addition, the precursor layer may contain tellurium as the group VI element in addition to selenium and sulfur.

In the case of forming the CIS-based photoelectric conversion layer 22, in the chalcogenization treatment of the precursor layer, the precursor layer containing the group I element and the group III element is subjected to a heat treatment in an atmosphere containing the group VI element to be chalcogenized, thereby forming the photoelectric conversion layer 22.

For example, first, selenization by a vapor phase selenization method is performed. The selenization is performed by heating the precursor layer in an atmosphere of a selenium source gas (for example, hydrogen selenide or selenium vapor) containing selenium as a group VI element source. Although not particularly limited, selenization is preferably performed, for example, at a temperature within a range of 300° C. or more and 600° C. or less in a heating furnace.

As a result, the precursor layer is converted into a compound (photoelectric conversion layer 22) containing the group I element, the group III element, and selenium. The compound (photoelectric conversion layer 22) containing the group I element, the group III element, and selenium may be formed by a method other than the gas phase selenization method. For example, such a compound can also be formed by a solid-phase selenization method, a vapor deposition method, an ink application method, an electrode-position method, and the like.

Next, the photoelectric conversion layer 22 containing the group I element, the group III element, and selenium is sulfurized. The sulfurization is performed by heating the photoelectric conversion layer 22 in an atmosphere of a sulfur-containing sulfur source gas (for example, hydrogen sulfide or sulfur vapor). As a result, the photoelectric conversion layer 22 is converted into a compound containing the group I element, the group III element, and selenium and sulfur as the group VI element. In the surface portion of the photoelectric conversion layer 22, the sulfur source gas plays a role of substituting selenium in a crystal containing the group I element, the group III element, and selenium, for example, a chalcopyrite crystal with sulfur.

Although not particularly limited, sulfurization is preferably performed, for example, at a temperature within a range of 450° C. or more and 650° C. or less in a heating furnace.

On the other hand, when the CZTS-based photoelectric conversion layer 22 is formed, the precursor layer is formed as a thin film of Cu—Zn—Sn or Cu—Zn—Sn—Se—S. In the chalcogenization treatment of the precursor layer, the precursor layer containing Cu, Zn, and Sn is sulfurized and selenized in a hydrogen sulfide atmosphere and a hydrogen selenide atmosphere at 500° C. to 650° C. Thus, the CZTS-based photoelectric conversion layer 22 having $Cu_2ZnSn(S, Se)_4$ can be formed.

Along with the chalcogenization treatment of the precursor layer, the group VI compound layer 21a containing Mo $(Se, S)_2$ is formed at the interface between the first electrode layer 21 and the photoelectric conversion layer 22.

The buffer layer 23 is formed by forming a thin film of Zn(O, S) or the like on the photoelectric conversion layer 22 by a method such as a chemical bath deposition (CBD) method, a sputtering method, a CVD method, or an ALD method. As described above, the formation of the buffer layer 23 may be omitted.

The second electrode layer 24 is formed on the buffer layer 23 by a method such as a sputtering method, a CVD method, or an ALD method. The second electrode layer 24 is, for example, a transparent electrode made of a thin film such as ZnO doped with B, Al, Ga, or In as a dopant.

(I-2) Removal of Photoelectric Conversion Layer 22 to Second Electrode Layer 24 (FIG. 3(A))

Next, as illustrated in FIG. 3(A), the photoelectric conversion layer 22, the buffer layer 23, and the second electrode layer 24 are removed in the second region 13 of the solar cell. The removal of these layers is carried out by mechanical scribing as an example. As a result, in the second region 13 of the solar cell, the first electrode layer 21 is exposed to the light receiving surface side. In FIG. 3(A), a portion removed from the solar cell is indicated by a broken line.

(I-3) Removal of First Electrode Layer 21 (FIG. 3(B))

Next, as illustrated in FIG. 3(B), the first electrode layer 21 is further removed in the second region 13 of the solar cell. As a result, in the second region 13 of the solar cell, the substrate 11 is exposed to the light receiving surface side. In FIG. 3(B), a portion removed from the solar cell is indicated by a broken line.

Here, the removal of the first electrode layer 21 is performed by laser irradiation (laser deletion) as an example. Although not particularly limited, as conditions of the laser deletion, for example, a pulsed laser in an infrared region having a wavelength of 1.06 μm may be applied, the diameter of the laser beam may be set to about 100 μm, and the energy density of the laser beam to be irradiated may be set to 1 W/cm² to 10 W/cm².

In addition, FIG. 3(B) illustrates an aspect in which the position of the end of the first electrode layer 21 is aligned with respect to each end of the photoelectric conversion layer 22, the buffer layer 23, and the second electrode layer 24 in the horizontal direction. However, the end of the first electrode layer 21 may not necessarily be aligned with the end of the photoelectric conversion layer 22 or the like. For example, the first electrode layer 21 may slightly protrude toward the second region side from the end of the photoelectric conversion layer 22 or the like, and an edge space (not illustrated) where the photoelectric conversion layer 22 or the like is not stacked may be formed on the first electrode layer 21.

(I-4) Formation of Insulating Layer 25 (FIG. 3(C))

Next, the light receiving surface side of the second electrode layer 24 is covered with a mask M, and then the insulating layer 25 is formed in the second region 13 on the substrate 11. The insulating layer 25 is formed by applying a film forming process of a semiconductor thin film such as a sputtering method, a CVD method, a vapor deposition method, an optical Mod (Metal Organic Deposition) method, or an AD (Aerosol Deposition) method.

Note that the region covered with the mask M preferably does not include the boundary between the first region 12 and the second region 13. When the region covered with the mask M includes the boundary between the first region 12 and the second region 13, the insulating layer 25 is not formed on each end surface in the planar direction of the first electrode layer 21, the photoelectric conversion layer 22, the buffer layer 23, and the second electrode layer 24. As a result, in the subsequent step of forming the collector electrode 14, there arises a problem in that the end surfaces in the planar direction of the first electrode layer 21, the photoelectric conversion layer 22, the buffer layer 23, and the second electrode layer 24 are covered with the collector electrode 14, and the second electrode layer 24 and the first electrode layer 21 are electrically connected (short-circuited).

(I-5) Formation of Collector Electrode 14 (FIG. 3(D))

Next, the mask M of the second electrode layer 24 is once removed, and then a region other than the range in which the collector electrode 14 is formed in the first region 12 and the second region 13 is covered with the mask, and the collector electrode 14 (bus bar electrode 17) is formed on the light receiving surface. The collector electrode 14 can be formed, for example, by applying a printing process such as an inkjet method or a screen printing method in addition to a sputtering method, a CVD method, an ALD method, an AD method, and a vapor deposition method.

(I-6) Joining of Interconnector 15 (FIG. 3(E))

Next, the end of the interconnector 15 made of a conductive metal is disposed on the light receiving surface side of the bus bar electrode 17, and then the interconnector 15 is joined to the solar cell.

The joining of the interconnectors 15 is performed by, for example, a parallel gap welding method using a resistance welding machine whose control method is a transistor type. Specifically, a pair of electrodes (not illustrated) partitioned by a narrow gap is disposed above the second region 13, and the interconnector 15 is welded to the bus bar electrode 17 in the second region 13.

The welding conditions are, for example, a welding current of 50 to 200 A and a welding time of 50 to 100 msec.

Hereinafter, effects of the solar cell 10 of the first embodiment will be described with reference to a comparative example illustrated in FIG. 4.

Figure 4:
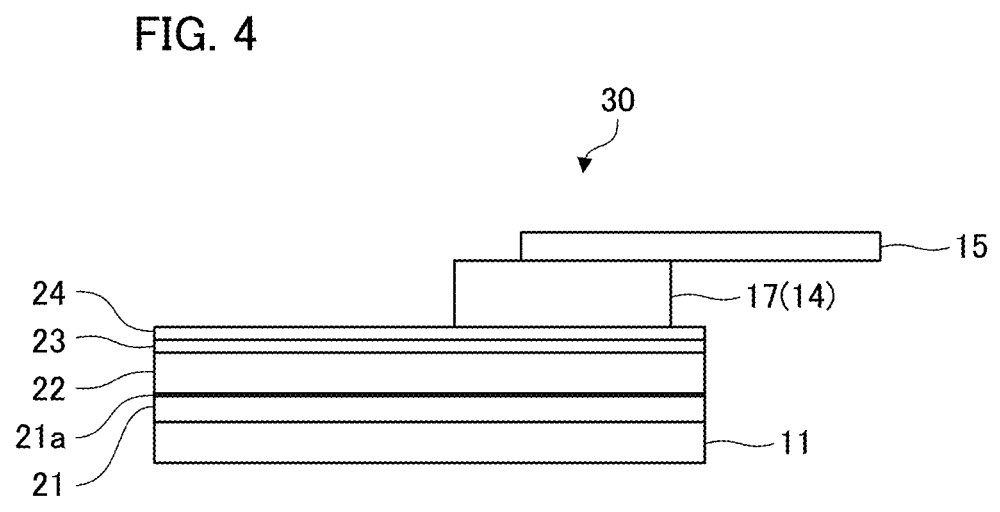

The solar cell 30 of the comparative example of FIG. 4 corresponds to a configuration in which the joined portion of the interconnector 15 is provided in the first region. In the case of the comparative example of FIG. 4, the joined portion of the interconnector 15 is disposed so as to overlap the first electrode layer 21 and the photoelectric conversion layer 22 in plan view. Therefore, when an external force acts on the joined portion of the interconnector 15, the photoelectric conversion layer 22 is peeled off from the substrate 11 side due to cleavage of the group VI compound layer 21*a* at the interface between the first electrode layer 21 and the photoelectric conversion layer 22, which may damage the joined portion of the interconnector 15.

In contrast to the above-described comparative example, in the first embodiment illustrated in FIG. 2(A), the joined portion of the interconnector 15 is formed on the substrate 11 and the insulating layer 25 in the second region 13. That is, in the first embodiment, since there is no interface between the first electrode layer 21 and the photoelectric conversion layer 22 under the joined portion of the interconnector 15, the joined portion is hardly peeled off from the substrate 11 side even if an external force acts on the joined portion of the interconnector 15. Therefore, according to the first embodiment, the interconnector 15 can be joined with higher adhesion strength than the comparative example.

In addition, in the solar cell 10 of the first embodiment, when the joined portion of the interconnector 15 is formed by welding, the joined portion of the interconnector 15 is not in the first region 12. Therefore, the method for manufacturing the solar cell 10 of the first embodiment is less likely to be damaged (shunt, dielectric breakdown) in the first region 12 where photoelectric conversion of the solar cell 30 is performed by energy during welding than the method for manufacturing the solar cell 30 of the comparative example.

In addition, in the first embodiment, the insulating layer 25 is present between the joined portion of the interconnector 15 and the substrate at the end of the second region. Therefore, since the joined portion of the interconnector 15 is electrically separated from the element on the positive electrode side (for example, a conductive substrate) at the end of the second region 13, a loss related to the shunt resistor during the operation of the solar cell is suppressed.

Since the bus bar electrode 17 is formed on the insulating layer 25 in the second region 13, the solar cell 10 is not short-circuited.

Modification of First Embodiment

Figure 2B:
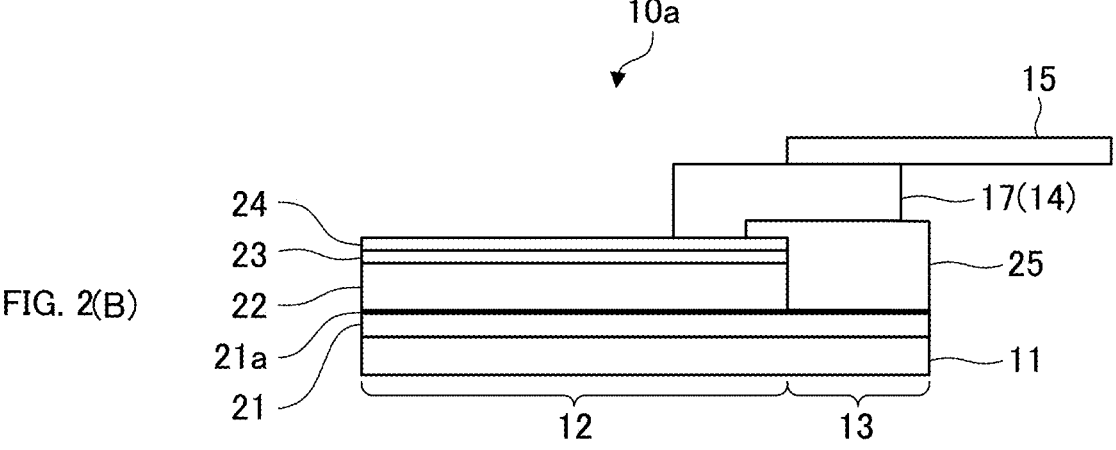
FIG. 2(B) is a view illustrating an example of a cross-section in a thickness direction in a solar cell of a modification of the first embodiment.

FIG. 2(B) is a view illustrating an example of a cross-section in a thickness direction of a solar cell 10*a* according to a modification of the first embodiment. In the following description of modifications and other embodiments, redundant description of elements common to the first embodiment will be appropriately omitted.

The configuration of the solar cell 10*a* illustrated in FIG. 2(B) is different from the configuration of FIG. 2(A) in that the first electrode layer 21 is provided on the substrate 11 in the second region 13, and the insulating layer 25 is formed on the first electrode layer 21. In the second region 13 of the solar cell 10*a*, there is no photoelectric conversion layer 22, and therefore there is no interface between the first electrode layer 21 and the photoelectric conversion layer 22.

A method for manufacturing a solar cell in the modification of the first embodiment is different from the first embodiment illustrated in FIG. 3 in the following points. In the case of the modification of the first embodiment, the steps up to the step of removing the photoelectric conversion layer 22, the buffer layer 23, and the second electrode layer 24 (FIG. 3(A)) are the same as those in the first embodiment. Thereafter, the insulating layer 25 is formed on the first electrode layer 21 without removing the first electrode layer 21 (FIG. 3(B)). The subsequent steps are the same as those in the first embodiment.

Also in the configuration of FIG. 2(B), the interconnector 15 can be joined with high adhesion strength as compared with the comparative example for the following two reasons.

The first reason is that voids (not illustrated) are generated between the photoelectric conversion layer 22 and the group VI compound layer 21*a* in the manufacturing steps of the solar cell. In the modification of the first embodiment, since the insulating layer 25 is formed again on the group VI compound layer 21*a* after the photoelectric conversion layer 22 is removed, voids are hardly formed between the group VI compound layer 21*a* and the insulating layer 25. Therefore, in the modification of the first embodiment, as compared with the adhesion strength between the group VI compound layer 21*a* and the photoelectric conversion layer 22, the adhesion strength between the group VI compound layer 21*a* and the insulating layer 25 is higher because there are fewer voids between the layers. As a result, in the modification of the first embodiment, the interconnector 15 can be joined with higher adhesion strength than the comparative example.

As a second reason, in the modification of the first embodiment, the photoelectric conversion layer 22 is removed from the second region 13 before the insulating layer 25 is formed. In this step, the group VI compound layer 21*a* is peeled off to some extent from the surface of the first electrode layer 21. Therefore, in the modification of the first embodiment, since the thickness of the group VI compound layer 21*a* in the second region is thinner than that in the comparative example, the insulating layer 25 is less likely to be peeled off from the substrate 11 side. As a result, in the modification of the first embodiment, the interconnector 15 can be joined with higher adhesion strength than the comparative example.

Second Embodiment

Figure 5A:
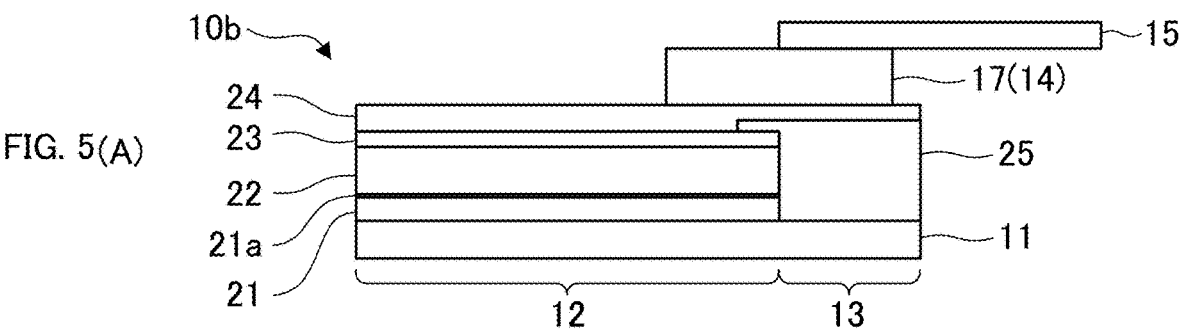
FIG. 5(A) is a view illustrating an example of a cross-section in a thickness direction in a solar cell of a second embodiment.

FIG. 5(A) is a view illustrating an example of a cross-section in the thickness direction of a solar cell 10*b* of a second embodiment. The solar cell 10*b* of the second embodiment has a configuration in which the second electrode layer 24 is formed on the upper surface of the insulating layer 25 in the second region 13.

The insulating layer 25 of the second embodiment illustrated in FIG. 5(A) is formed so as to cover each end surface in the planar direction of the first electrode layer 21, the photoelectric conversion layer 22, and the buffer layer 23, and partially cover the light receiving surface side of the buffer layer 23 in the first region 12. Then, the second electrode layer 24 is formed so as to cover the buffer layer 23 in the first region 12 and the insulating layer 25 in the second region 13, and the bus bar electrode 17 of the collector electrode 14 is stacked on the second electrode layer 24.

In addition, the interconnector 15 is joined to the light receiving surface side of the bus bar electrode 17. Also in the second embodiment, the joined portion of the interconnector 15 is located on the substrate 11 and the insulating layer 25 in the second region 13 and is shifted from the first region 12. A portion that is not a joined portion of the interconnector 15 (for example, a portion not welded and joined) may be provided on the first region 12.

Also in the configuration of the second embodiment, the same effects as those of the first embodiment can be obtained.

Here, a method for manufacturing the solar cell of the second embodiment will be described. FIGS. 6(A)-6(F) are a view schematically illustrating a method for manufacturing the solar cell 10*b* in FIG. 5(A).

(II-1) Preparation of Solar Cell

First, a solar cell in which the first electrode layer 21, the photoelectric conversion layer 22, and the buffer layer 23 are sequentially formed on the substrate 11 is prepared. The steps of forming the first electrode layer 21, the photoelectric conversion layer 22, and the buffer layer 23 are the same as those in the first embodiment.

(II-2) Removal of Photoelectric Conversion Layer 22 and Buffer Layer 23 (FIG. 6(A))

Next, as illustrated in FIG. 6(A), the photoelectric conversion layer 22 and the buffer layer 23 are removed in the second region 13 of the solar cell. The removal of these layers is carried out by mechanical scribing as an example. As a result, in the second region 13 of the solar cell, the first electrode layer 21 is exposed to the light receiving surface side. In FIG. 6(A), a portion removed from the solar cell is indicated by a broken line.

(II-3) Removal of First Electrode Layer 21 (FIG. 6(B))

Next, as illustrated in FIG. 6(B), the first electrode layer 21 is further removed in the second region 13 of the solar cell. This step is the same as those in the above-described first embodiment. As a result, in the second region 13 of the solar cell, the substrate 11 is exposed to the light receiving surface side. In FIG. 6(B), a portion removed from the solar cell is indicated by a broken line.

(II-4) Formation of Insulating Layer 25 (FIG. 6(C))

Next, the light receiving surface side of the buffer layer 23 is covered with a mask M, and then the insulating layer 25 is formed in the second region 13 on the substrate 11. The method for forming the insulating layer 25 is the same as that in the first embodiment.

Note that the region covered with the mask M preferably does not include the boundary between the first region 12 and the second region 13. When the region covered with the mask M includes the boundary between the first region 12 and the second region 13, the insulating layer 25 is not formed on each end surface in the planar direction of the first electrode layer 21, the photoelectric conversion layer 22, and the buffer layer 23. As a result, in the subsequent step of forming the second electrode layer 24, the end surfaces of the first electrode layer 21, the photoelectric conversion layer 22, and the buffer layer 23 in the planar direction are covered with the second electrode layer 24, and there occurs a problem in that the second electrode layer 24 and the first electrode layer 21 are electrically connected (short-circuited).

(II-5) Formation of Second Electrode Layer 24 (FIG. 6(D))

Next, the mask M on the buffer layer 23 is removed, and the second electrode layer 24 is formed so as to cover the buffer layer 23 in the first region 12 and the insulating layer 25 in the second region 13. The method for forming the second electrode layer 24 is the same as that in the first embodiment.

(II-6) Formation of Collector Electrode 14 (FIG. 6(E))

Next, a region other than the range where the collector electrode 14 is formed in the first region 12 and the second region 13 is covered with the mask M, and the collector electrode 14 (bus bar electrode 17) is formed on the light receiving surface of the second electrode layer 24. The method for forming the collector electrode 14 is the same as that in the first embodiment.

(II-7) Joining of Interconnector 15 (FIG. 6(F))

Next, the end of the interconnector 15 made of a conductive metal is disposed on the light receiving surface side of the bus bar electrode 17, and the interconnector 15 is joined to the bus bar electrode 17 by welding in the second region 13. The welding of the interconnector 15 is the same as that in the first embodiment.

Modification of Second Embodiment

Figure 5B:
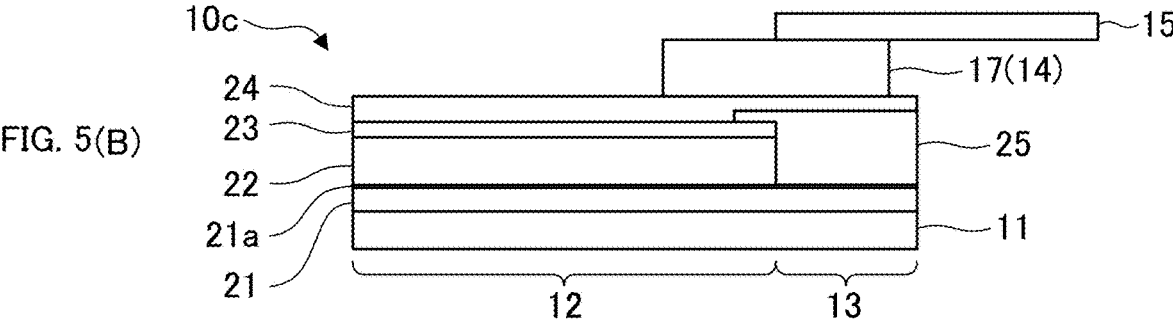
FIG. 5(B) is a view illustrating an example of a cross-section in a thickness direction in a solar cell of a modification of the second embodiment.

FIG. 5(B) is a view illustrating an example of a cross-section in a thickness direction of a solar cell 10c according to a modification of the second embodiment. The configuration of the solar cell 10c illustrated in FIG. 5(B) is different from the configuration of FIG. 5(A) in that the first electrode layer 21 is provided on the substrate 11 in a second region 13, and the insulating layer 25 is formed on the first electrode layer 21.

In the case of the modification of the second embodiment, the same effects as those of the modification of the first embodiment illustrated in FIG. 2(B) can be obtained.

A method for manufacturing a solar cell in the modification of the second embodiment is different from the second embodiment illustrated in FIGS. 6(A)-6(F) in the following points. In the case of the modification of the second embodiment, the steps up to the step of removing the photoelectric conversion layer 22 and the buffer layer 23 (FIG. 6(A)) are the same as those in the second embodiment. Thereafter, the insulating layer 25 is formed on the first electrode layer 21 without removing the first electrode layer 21 (FIG. 6(B)). The subsequent steps are the same as those in the second embodiment.

Third Embodiment

Figure 7A:
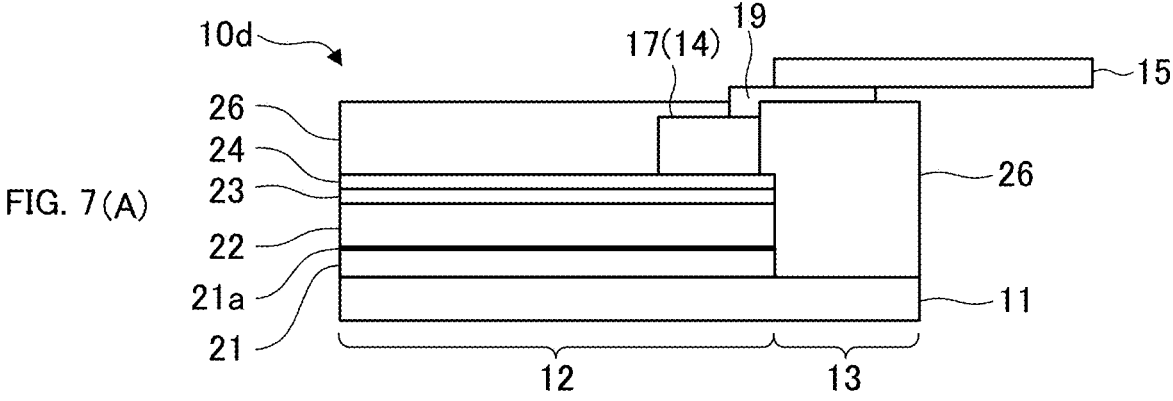
FIG. 7(A) is a view illustrating an example of a cross-section in a thickness direction in a solar cell of a third embodiment.

FIG. 7(A) is a view illustrating an example of a cross-section in the thickness direction of a solar cell 10d of a third embodiment. The solar cell 10d of the third embodiment has a configuration in which the entire cell is covered with an insulating film 26 having optical transparency. The insulating film 26 is an example of the insulating layer.

In the first region 12 of FIG. 7(A), the first electrode layer 21, the photoelectric conversion layer 22, the buffer layer 23, and the second electrode layer 24 are sequentially stacked on the substrate 11. The collector electrode 14 (bus bar electrode 17) is provided on the second electrode layer 24. In addition, the first electrode layer 21, the photoelectric conversion layer 22, the buffer layer 23, and the second electrode layer 24 are not provided in the second region 13 of FIG. 7(A).

In FIG. 7(A), the insulating film 26 is stacked on both the second electrode layer 24 and the bus bar electrode 17 in the first region 12 and the substrate 11 in the second region 13. The insulating film 26 is formed so as to cover each end surface in the planar direction of the first electrode layer 21, the photoelectric conversion layer 22, the buffer layer 23, and the second electrode layer 24, and partially cover the light receiving surface side of the second electrode layer 24 in the first region 12. In addition, on the upper side of the insulating film 26 in the second region 13, a thin-film conductive portion 19 electrically connected to the bus bar electrode 17 in the first region 12 is formed. In the second region 13, the interconnector 15 is joined to the conductive portion 19 stacked on the insulating film 26. The conductive portion 19 is an example of a current collector.

The material exemplified as the material of the collector electrode 14 can be applied as the material of the conductive portion 19. The material of the conductive portion 19 may be the same as or different from the material of the collector electrode 14. In addition, the conductive portion 19 may also be formed of a layered product of a plurality of materials.

As described above, also in the third embodiment illustrated in FIG. 7(A), the joined portion of the interconnector 15 is formed on the substrate 11 and the insulating film 26 in the second region 13. Therefore, the same effects as those of the first embodiment can be obtained also in the third embodiment. A portion that is not a joined portion of the interconnector 15 (for example, a portion not welded and joined) may be provided on the first region 12.

Here, the insulating film 26 of the third embodiment has at least one function of, for example, a shielding layer that shields a proton beam or a heat radiation layer that increases infrared radiation efficiency.

For example, a case where a solar cell is operated in space is considered. When a solar cell is operated in space, it is known that lattice defects are generated in a semiconductor by irradiation with a proton beam, and the output of the cell is reduced. In this regards, when the insulating film 26 is stacked on the photoelectric conversion layer 22, the shielding effect on the proton beam is improved, and deterioration of the cell due to the proton beam can be suppressed.

In addition, since a solar cell in space cannot exchange heat with the atmosphere, cooling is performed by infrared radiation, but the efficiency of infrared radiation can be increased by stacking the insulating film 26 on the photoelectric conversion layer 22.

As the material of the insulating film 26 of the third embodiment, it is preferable to use a material having a high insulating property and light transmittance and having a refractive index between the photoelectric conversion layer 22 and vacuum in order to suppress reflection of light. Examples of the material of the insulating film 26 of the third embodiment include $Al_2O_3$, $Y_2O_3$, $ZrO_2$, $MgO$, $HfO_2$, $Bi_2O_3$, $TiO_2$, $ZnO$, $In_2O_3$, $SnO_2$, $Nb_2O_5$, $Ta_2O_5$, and $SiO_2$. Among the above materials, $SiO_2$ and $Al_2O_3$ have high emissivity, and thus are effective as materials of the heat radiation layer.

In addition, the insulating film 26 may be a multilayer film in which layers of different materials selected from the above materials are stacked. From the viewpoint of increasing the infrared emissivity of the solar cell, it is preferable to stack materials having different refractive indexes and extinction coefficients for the insulating film 26. Although not particularly limited, the thickness of the insulating film 26 is, for example, 0.1 μm to 50 μm.

Here, a method for manufacturing the solar cell of the third embodiment will be described. FIGS. 8(A)-8(E) are a view schematically illustrating a method for manufacturing the solar cell 10*d* in FIG. 7(A).

(III-1) Preparation of Solar Cell

First, a solar cell in which the first electrode layer 21, the photoelectric conversion layer 22, the buffer layer 23, the second electrode layer 24, and the collector electrode 14 are sequentially formed on the substrate 11 is prepared. The collector electrode 14 is formed on the first region 12. The steps of forming the first electrode layer 21, the photoelectric conversion layer 22, the buffer layer 23, the second electrode layer 24, and the collector electrode 14 are the same as those in the first embodiment.

Figures 8A, 8B, 8C, 8D, 8E:
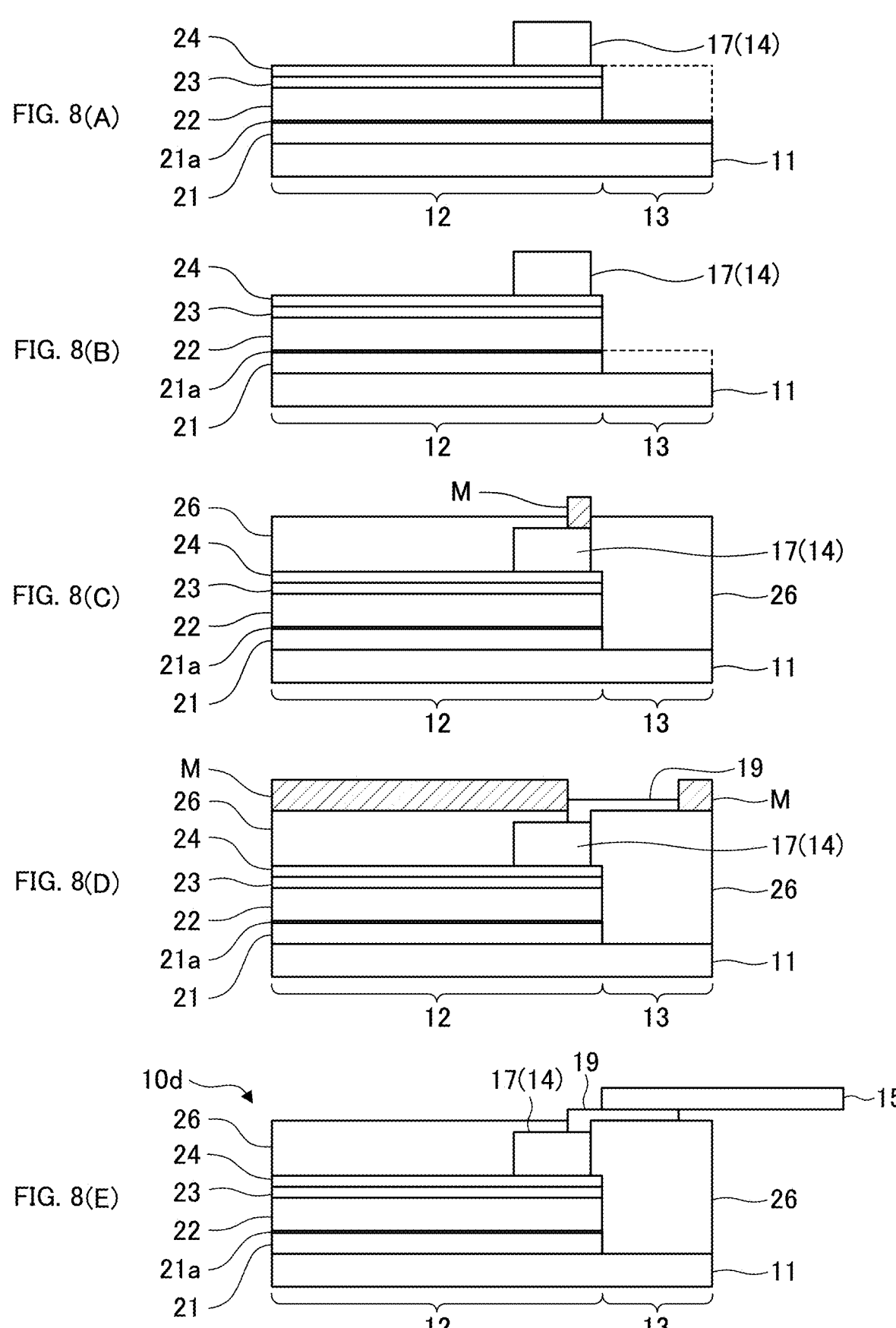
FIGS. 8(A)-8(E) are a view schematically illustrating a method for manufacturing the solar cell of FIG. 7(A).

(III-2) Removal of Photoelectric Conversion Layer 22, Buffer Layer 23, and Second Electrode Layer 24 (FIG. 8(A))

Next, as illustrated in FIG. 8(A), the photoelectric conversion layer 22, the buffer layer 23, and the second electrode layer 24 are removed in the second region 13 of the solar cell. The removal of these layers is carried out by mechanical scribing as an example. As a result, in the second region 13 of the solar cell, the first electrode layer 21 is exposed to the light receiving surface side. In FIG. 8(A), a portion removed from the solar cell 10 is indicated by a broken line.

(III-3) Removal of First Electrode Layer 21 (FIG. 8(B))

Next, as illustrated in FIG. 8(B), the first electrode layer 21 is further removed in the second region 13 of the solar cell. This step is the same as those in the above-described first embodiment. As a result, in the second region 13 of the solar cell, the substrate 11 is exposed to the light receiving surface side. In FIG. 8(B), a portion removed from the solar cell is indicated by a broken line.

(III-4) Formation of Insulating Film 26 (FIG. 8(C))

Next, after a part of the upper surface of the collector electrode 14 is covered with the mask M, the insulating film 26 having optical transparency is formed over the first region 12 and the second region 13. As a result, the entire cell is covered with the insulating film 26. The method for forming the insulating film 26 is the same as that in the first embodiment.

(III-5) Formation of Conductive Portion 19 (FIG. 8(D))

Next, the mask M on the collector electrode 14 is removed, the first region 12 and the second region 13 are covered with the mask M except for the formation range of the conductive portion 19, and then the conductive portion 19 is formed. The formation range of the conductive portion 19 includes the portion masked in FIG. 8(C). As a result, the conductive portion 19 electrically connected to the collector electrode 14 and exposed to the outside of the insulating film 26 is formed in the second region. As a method of forming the conductive portion 19, a method applicable to the formation of the collector electrode 14 can be appropriately adopted.

(III-6) Joining of Interconnector 15 (FIG. 8(E))

Next, the end of the interconnector 15 made of a conductive metal is disposed on the conductive portion 19, and the interconnector 15 is joined to the conductive portion 19 by welding in the second region. The welding of the interconnector 15 is the same as that in the first embodiment.

Modification of Third Embodiment

Figure 7B:
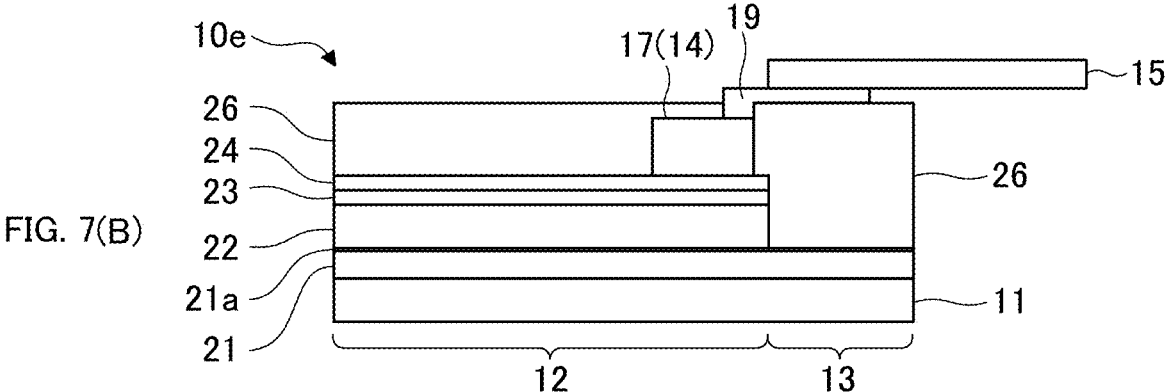
FIG. 7(B) is a view illustrating an example of a cross-section in a thickness direction in a solar cell of a modification of the third embodiment.

FIG. 7(B) is a view illustrating an example of a cross-section in a thickness direction of a solar cell 10*e* according to a modification of the third embodiment. The configuration of the solar cell 10*e* illustrated in FIG. 7(B) is different from the configuration of FIG. 7(A) in that the first electrode layer 21 is provided on the substrate 11 in the second region 13, and the insulating film 26 is formed on the first electrode layer 21.

In the case of the modification of the third embodiment, the entire cell is covered with the insulating film 26, so that the same effect as that of the third embodiment can be obtained. In addition, in the case of the modification of the third embodiment, it is possible to obtain the same effect as that of the modification of the first embodiment illustrated in FIG. 2(B) with respect to the adhesion strength of the joined portion of the interconnector 15.

A method for manufacturing a solar cell in the modification of the third embodiment is different from the third embodiment illustrated in FIGS. 8(A)-8(E) in the following points. In the case of the modification of the third embodiment, the steps up to the step of removing the photoelectric conversion layer 22, the buffer layer 23, and the second electrode layer 24 (FIG. 8(A)) are the same as those in the third embodiment. Thereafter, the insulating film 26 is formed on the first electrode layer 21 without removing the first electrode layer 21 (FIG. 8(B)). The subsequent steps are the same as those in the third embodiment.

Fourth Embodiment

Figure 9A:
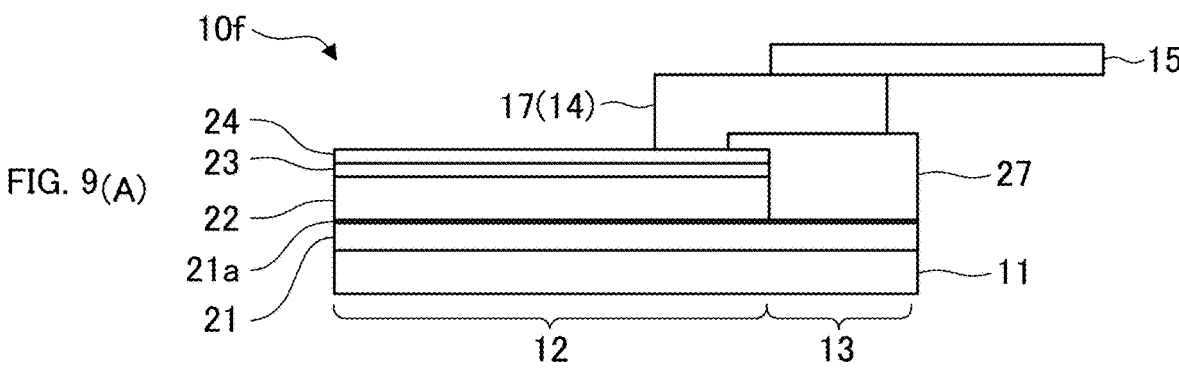
FIG. 9(A) is a view illustrating an example of a cross-section in a thickness direction in a solar cell of a fourth embodiment.

FIG. 9(A) is a view illustrating an example of a cross-section in the thickness direction of a solar cell 10*f* of a fourth embodiment. The solar cell 10*f* is a configuration example in which a hydrophilic layer 27 is formed on the first electrode layer 21 in the second region 13.

In the second region 13 of the solar cell 10*f* of FIG. 9(A), the photoelectric conversion layer 22, the buffer layer 23, and the second electrode layer 24 are not provided. The hydrophilic layer 27 is formed on the first electrode layer 21 in the second region 13. The hydrophilic layer 27 is formed so as to cover each end surface in the planar direction of the photoelectric conversion layer 22, the buffer layer 23, and the second electrode layer 24, and partially cover the light receiving surface side of the second electrode layer 24 in the first region 12. As a material of the hydrophilic layer 27, for example, a Ca phosphate-based hydrophilic material can be used. Although not particularly limited, the thickness of the hydrophilic layer 27 is, for example, 0.1 μm to 50 μm.

In addition, the bus bar electrode 17 of the collector electrode 14 is stacked on the light receiving surface side of the hydrophilic layer 27. Then, the interconnector 15 is joined to the light receiving surface side of the bus bar electrode 17. As illustrated in FIG. 9(A), the joined portion of the interconnectors 15 is at a position overlapping the second region 13 in the planar direction, and is shifted from the first region 12. A portion that is not a joined portion of the interconnector 15 (for example, a portion not welded and joined) may be provided on the first region 12.

By forming the hydrophilic layer 27 having hydrophilicity on the first electrode layer 21, the hydrophilic layer 27 is less likely to be displaced in the planar direction with respect to the first electrode layer 21. Therefore, according to the configuration of the fourth embodiment, improvement of the adhesion strength of the joined portion of the interconnector 15 in the second region 13 can be expected.

In addition, the material of the hydrophilic layer 27 is generally an insulator. Therefore, at the end of the second region 13, the joined portion of the interconnector 15 can be electrically separated from the element on the positive electrode side (for example, the conductive substrate) by the hydrophilic layer 27. When the insulating performance of hydrophilic layer 27 is not sufficient, an insulating film (not illustrated) may be further formed on the hydrophilic layer 27.

Here, a method for manufacturing the solar cell of the fourth embodiment will be described. FIGS. 10(A)-10(D) are a view schematically illustrating a method for manufacturing the solar cell 10ƒ in FIG. 9(A).

(IV-1) Preparation of Solar Cell

First, a solar cell in which the first electrode layer 21, the photoelectric conversion layer 22, the buffer layer 23, and the second electrode layer 24 are sequentially formed on the substrate 11 is prepared. The steps of forming the first electrode layer 21, the photoelectric conversion layer 22, the buffer layer 23, and the second electrode layer 24 are the same as those in the first embodiment.

Figures 10A, 10B, 10C, 10D:
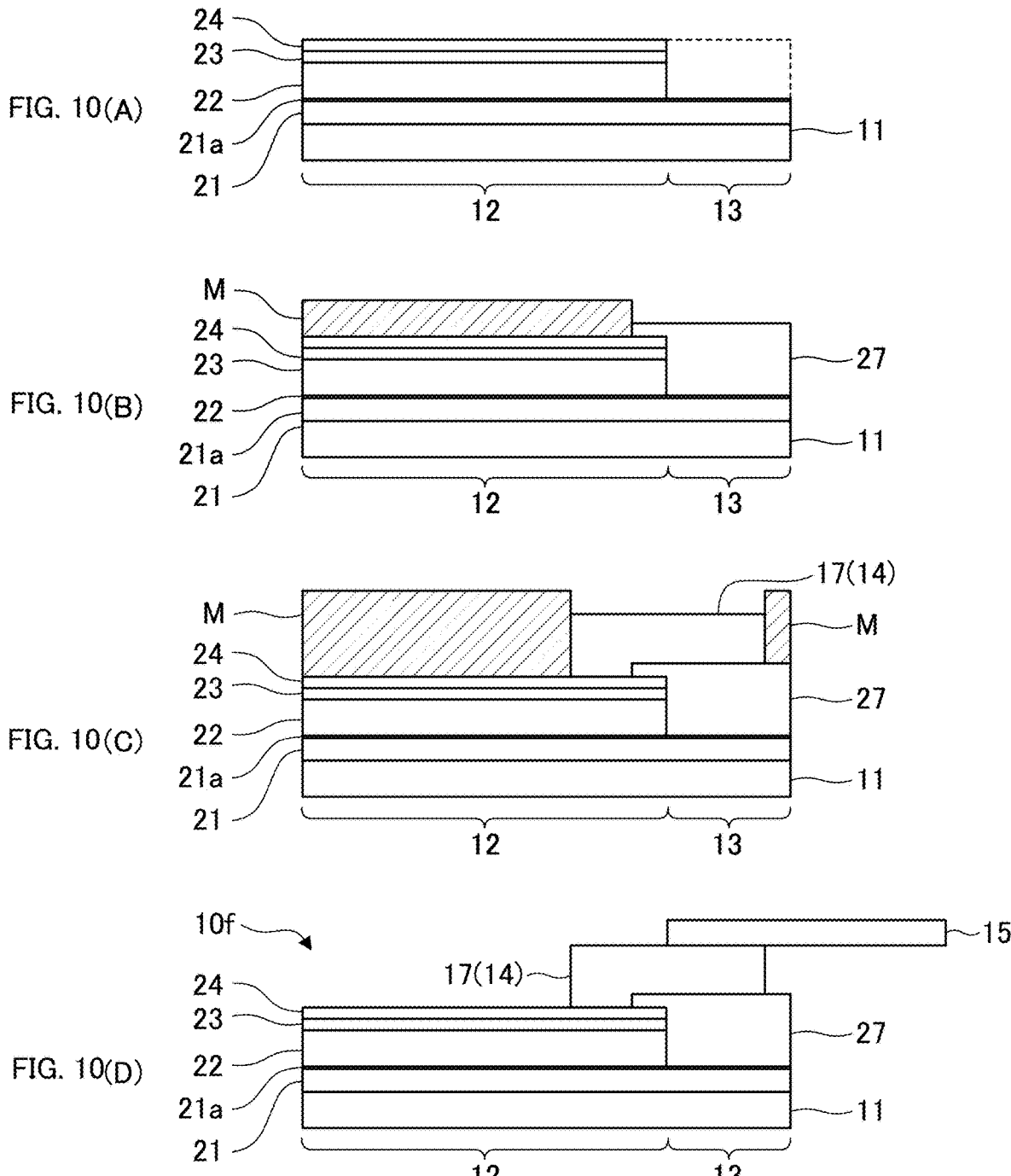
FIGS. 10(A)-10(D) are a view schematically illustrating a method for manufacturing the solar cell of FIG. 9(A).

(IV-2) Removal of Photoelectric Conversion Layer 22 to Second Electrode Layer 24 (FIG. 10(A))

Next, as illustrated in FIG. 10(A), the photoelectric conversion layer 22, the buffer layer 23, and the second electrode layer 24 are removed in the second region 13 of the solar cell. The removal of these layers is carried out by mechanical scribing as an example. As a result, in the second region 13 of the solar cell, the first electrode layer 21 is exposed to the light receiving surface side. In FIG. 10(A), a portion removed from the solar cell 10 is indicated by a broken line.

(IV-3) Formation of Hydrophilic Layer 27 (FIG. 10(B))

Next, after the light receiving surface side of the second electrode layer 24 is covered with the mask M, the hydrophilic layer 27 is formed on the first electrode layer 21 in the second region 13. The hydrophilic layer 27 is formed by applying a film forming process of a semiconductor thin film such as a sputtering method, a CVD method, a vapor deposition method, an optical Mod method, or an AD method.

Note that the region covered with the mask M preferably does not include the boundary between the first region 12 and the second region 13. When the region covered with the mask M includes the boundary between the first region 12 and the second region 13, the hydrophilic layer 27 is not formed on each end surface in the planar direction of the photoelectric conversion layer 22, the buffer layer 23, and the second electrode layer 24. As a result, in the subsequent step of forming the collector electrode 14, there arises a problem in that the end surfaces in the planar direction of the photoelectric conversion layer 22, the buffer layer 23, and the second electrode layer 24 are covered with the collector electrode 14, and the second electrode layer 24 and the first electrode layer 21 are electrically connected (short-circuited).

(IV-4) Formation of Collector Electrode 14 (FIG. 10(C))

Next, the mask M of the second electrode layer 24 is once removed, and then a region other than the range in which the collector electrode 14 is formed in the first region 12 and the second region 13 is covered with the mask, and the collector electrode 14 (bus bar electrode 17) is formed on the light receiving surface. The method for forming the collector electrode 14 is the same as that in the first embodiment.

(IV-5) Joining of Interconnector 15 (FIG. 10(D))

Next, the end of the interconnector 15 made of a conductive metal is disposed on the conductive portion 19, and the interconnector 15 is joined to the conductive portion 19 by welding in the second region. The welding of the interconnector 15 is the same as that in the first embodiment.

Modification of Fourth Embodiment

Figure 9B:
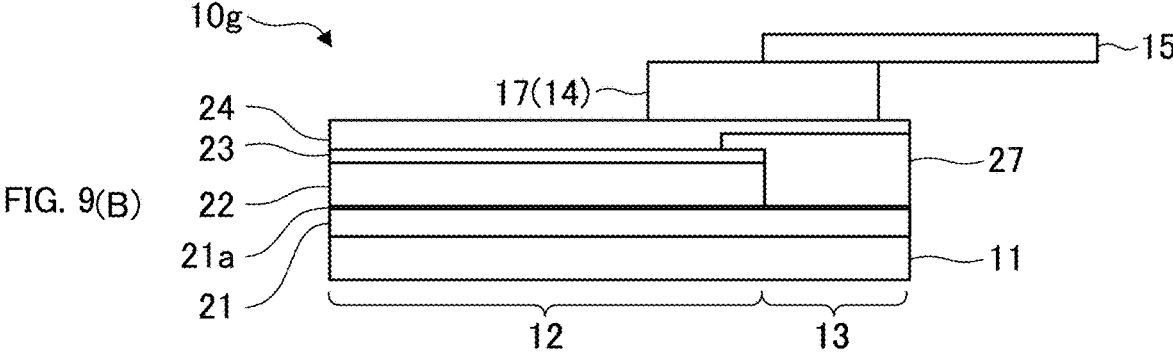
FIG. 9(B) is a view illustrating an example of a cross-section in a thickness direction in a solar cell of a modification of the fourth embodiment.

FIG. 9(B) is a view illustrating an example of a cross-section in a thickness direction of a solar cell log according to a modification of the fourth embodiment. The solar cell log is different from the configuration of FIG. 9(A) in that the second electrode layer 24 is formed on the upper surface of the hydrophilic layer 27 of the second region 13. Also in the solar cell 10g, the same effects as those of the configuration of FIG. 9(A) can be obtained.

Here, a method for manufacturing a solar cell in the modification of the fourth embodiment will be described. FIGS. 11(A)-11(E) are a view schematically illustrating a method for manufacturing the solar cell log in FIG. 9(B).

(V-1) Preparation of Solar Cell

First, a solar cell in which the first electrode layer 21, the photoelectric conversion layer 22, and the buffer layer 23 are sequentially formed on the substrate 11 is prepared. The steps of forming the first electrode layer 21, the photoelectric conversion layer 22, and the buffer layer 23 are the same as those in the first embodiment.

(V-2) Removal of Photoelectric Conversion Layer 22 and Buffer Layer 23 (FIG. 11(A))

Next, as illustrated in FIG. 11(A), the photoelectric conversion layer 22 and the buffer layer 23 are removed in the second region 13 of the solar cell. The removal of these layers is carried out by mechanical scribing as an example. As a result, in the second region 13 of the solar cell, the first electrode layer 21 is exposed to the light receiving surface side. In FIG. 11(A), a portion removed from the solar cell is indicated by a broken line.

(V-3) Formation of Hydrophilic Layer 27 (FIG. 11(B))

Next, after the light receiving surface side of the buffer layer 23 is covered with the mask M, the hydrophilic layer 27 is formed on the first electrode layer 21 in the second region 13. The method for forming the hydrophilic layer 27 is the same as that in the fourth embodiment.

Note that the region covered with the mask M preferably does not include the boundary between the first region 12 and the second region 13. When the region covered with the mask M includes the boundary between the first region 12 and the second region 13, the hydrophilic layer 27 is not formed on each end surface in the planar direction of the photoelectric conversion layer 22, and the buffer layer 23. As a result, in the subsequent step of forming the second electrode layer 24, each end surface of the photoelectric conversion layer 22 and the buffer layer 23 in the planar direction are covered with the second electrode layer 24, and there occurs a problem in that the second electrode layer 24 and the first electrode layer 21 are electrically connected (short-circuited).

(V-4) Formation of Second Electrode Layer 24 (FIG. 11(C))

Next, the mask M on the buffer layer 23 is removed, and the second electrode layer 24 is formed so as to cover the buffer layer 23 in the first region 12 and the hydrophilic layer 27 in the second region 13. The method for forming the second electrode layer 24 is the same as that in the first embodiment.

(V-5) Formation of Collector Electrode 14 (FIG. 11(D))

Next, a region other than the range where the collector electrode 14 is formed in the first region 12 and the second region 13 is covered with the mask M, and the collector electrode 14 (bus bar electrode 17) is formed on the light receiving surface of the second electrode layer 24. The method for forming the collector electrode 14 is the same as that in the first embodiment.

(V-6) Joining of Interconnector 15 (FIG. 11(E))

Next, the end of the interconnector 15 made of a conductive metal is disposed on the light receiving surface side of the bus bar electrode 17, and the interconnector 15 is joined to the bus bar electrode 17 by welding in the second region 13. The welding of the interconnector 15 is the same as that in the first embodiment.

EXAMPLES

Hereinafter, examples of the present invention will be described. In examples, in order to evaluate the adhesion strength of the joined portion of the interconnector, the following test was performed. In the test, the tip of the interconnector after welding is sandwiched between jigs, and the tip of the interconnector is pulled upward at a speed of 5 mm/min in a 45 degree direction using an autograph device. Then, the tensile strength (maximum strength) at the time when the interconnector is detached from the joined portion is measured.

As a test object, the following test pieces were used as a comparative example and Examples 1 to 3.

The test piece of the comparative example has a configuration in which a first electrode layer of molybdenum, a CIS-based photoelectric conversion element, a second electrode layer, and a collector electrode are sequentially stacked on a substrate, and an interconnector of an Ag foil is joined to the collector electrode. The test piece of the comparative example corresponds to the configuration in which the joined portion of the interconnector is provided on the first region (comparative example of FIG. 4).

On the other hand, the test piece of Example 1 has a configuration in which a first electrode layer of molybdenum, a CIS-based photoelectric conversion element, a second electrode layer, and a collector electrode are sequentially stacked on the substrate in the first region, an insulating layer and a collector electrode are sequentially stacked on the substrate in the second region, and an interconnector of an Ag foil is joined to the collector electrode in the second region. The insulating layer of the example is an $Al_2O_3$ film having a thickness of 4 μm. The test piece of Example 1 corresponds to the configuration (first embodiment) in which the joined portion of the interconnector is provided on the second region from which the first electrode layer is removed.

The test piece of Example 2 has a configuration in which a first electrode layer of molybdenum, a CIS-based photoelectric conversion element, a second electrode, and a collector electrode are sequentially stacked on the substrate in the first region, the first electrode layer of molybdenum, an insulating layer, and the collector electrode are sequentially stacked on the substrate in the second region, and an interconnector of an Ag foil is joined to the collector electrode in the second region. The insulating layer of Example 2 is an $Al_2O_3$ film having a thickness of 10 μm. The test piece of Example 2 corresponds to a configuration in which the joined portion of the interconnector is provided on the second region where the first electrode layer is formed (modification of the first embodiment).

The test piece of Example 3 has a configuration in which a first electrode layer of molybdenum, a CIS-based photoelectric conversion element, a second electrode layer, and a collector electrode are sequentially stacked on the substrate in the first region, the first electrode layer of molybdenum, an insulating layer, the second electrode layer, and the collector electrode are sequentially stacked on the substrate in the second region, and an interconnector of an Ag foil is joined to the collector electrode in the second region. The insulating layer of Example 3 is an $Al_2O_3$ film having a thickness of 4 μm. The test piece of Example 3 corresponds to a configuration in which the joined portion of the interconnector is provided on the second region where the first electrode layer is formed (modification of the second embodiment).

In addition, the collector electrodes of the test pieces in the comparative example and Example 1 were formed by stacking a Ni film having a thickness of 10 nm, an Al film having a thickness of 1 μm, and an Ag film having a thickness of 2 μm in this order from the substrate side.

The collector electrode of the test piece in Example 2 was formed by stacking a Ni film having a thickness of 10 nm and an Al film having a thickness of 16 μm.

The collector electrode of the test piece in Example 3 was formed by stacking a Ni film having a thickness of 10 nm and an Al film having a thickness of 1 μm.

The presence or absence of the Ag film in the collector electrode does not affect the tensile strength of the interconnector.

When the test results of the examples were normalized by the test result of the comparative example, the maximum strength of the test piece of the comparative example was 1, whereas the maximum strengths of the test piece of Example 1 to 3 were 6, 34, and 9, respectively. That is, it was confirmed that the adhesion strength in the configuration of Example 1 to 3 was improved to 6 times or more the configuration of the comparative example. In addition, it can be seen that the maximum strength increases even when the thickness of the insulating layer or the thickness of the collector electrode changes.

Configuration Example of Artificial Satellite

Next, an artificial satellite including a solar cell and a paddle for an artificial satellite will be described.

Figure 12:
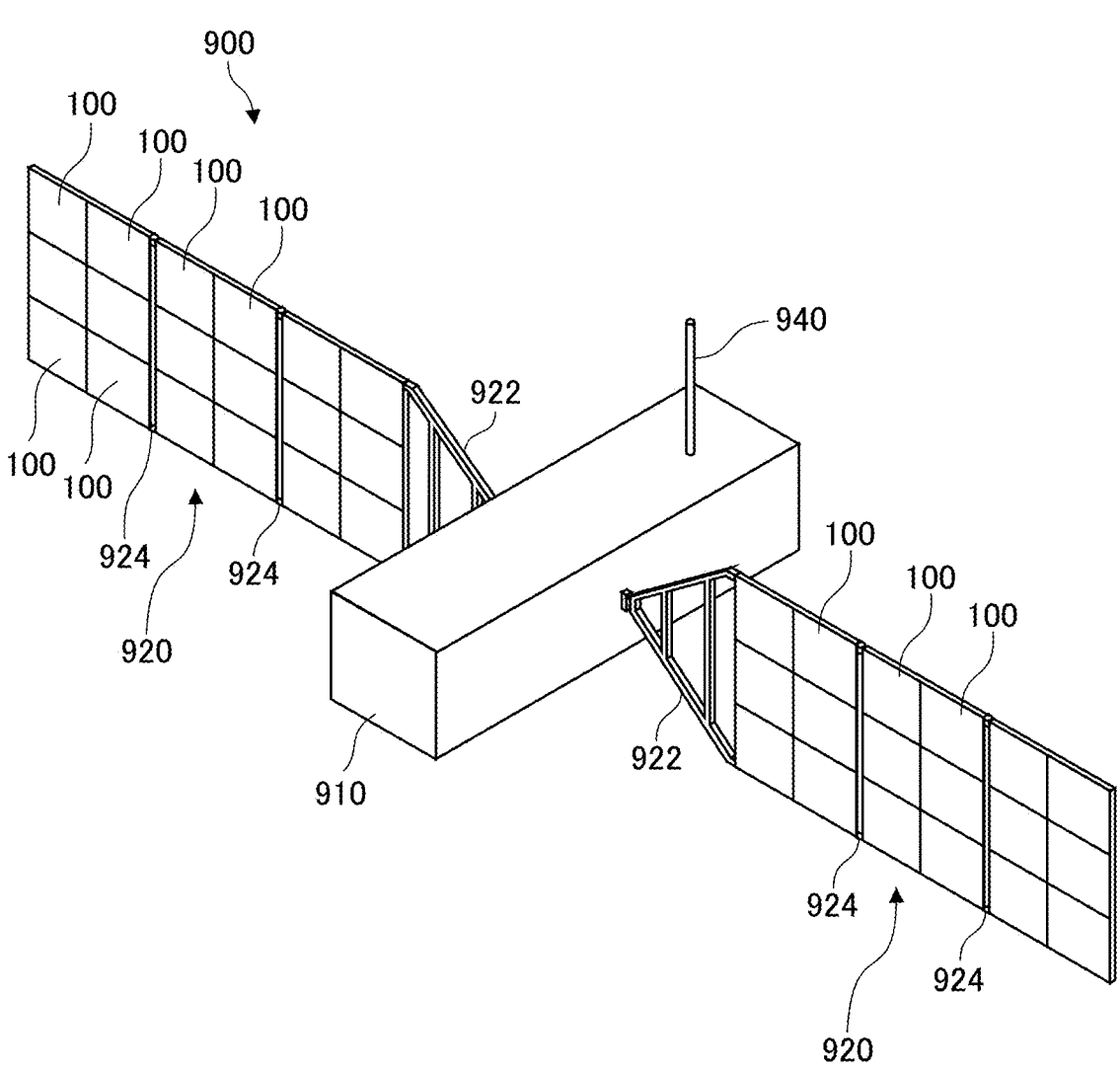
FIG. 12 is a schematic perspective view illustrating an example of an artificial satellite including a solar cell module.

FIG. 12 is a schematic perspective view illustrating an example of an artificial satellite including a solar cell module. An artificial satellite 900 may have a base 910 and a paddle 920. The base 910 may include a device (not illustrated) necessary for controlling the artificial satellite 900 or the like. An antenna 940 may be attached to the base 910.

FIG. 12 illustrates an example in which one paddle 920 is disposed on each of both sides of the base 910 of the artificial satellite 900, and each paddle 920 is deployed. The paddle 920 may include a solar cell module 100. The paddle 920 including the solar cell module 100 can be used as a power source for operating various devices provided on the base 910. As described above, the solar cell module 100 can be applied to a paddle for an artificial satellite.

One or a plurality of solar cells (photoelectric conversion elements) are sealed with, for example, a sealing material to constitute the solar cell module 100. The configuration of the solar cell of the solar cell module 100 is the same as that of any of the above embodiments. When the solar cell module 100 includes a plurality of solar cells, the plurality of solar cells may be arranged in at least one direction, and preferably may be arranged in a lattice pattern. In this case, the plurality of solar cells may be electrically connected to each other in series and/or in parallel. In addition, the solar cells may be electrically connected to each other by an interconnector. FIG. 12 illustrates an example in which a plurality of the solar cell modules 100 are arranged on each of the paddles 920.

The paddle 920 may include a connecting portion 922 and a hinge portion 924. The connecting portion 922 corresponds to a portion connecting the paddle 920 to the base 910.

The hinge portion 924 extends along one direction, and the paddle 920 can be bent with the hinge portion 924 as a rotation axis. Each of the paddles 920 may have at least one, preferably a plurality of the hinge portions 924. Thus, the paddle 920 including the solar cell modules 100 is configured to be small and foldable. When the artificial satellite 900 is launched, the paddle 920 may be folded. The paddle 920 may be deployed when receiving sunlight to generate power.

Instead of the structure as illustrated in FIG. 12, the paddle 920 may have a cylindrical shape formed by being wound. Accordingly, the paddle 920 can take a substantially flat developed state by the rotation of the wound portion. When the artificial satellite 900 is launched, the paddle 920 may maintain a generally cylindrical shape. The paddle 920 may be deployed in a substantially flat state when receiving sunlight to generate power.

Supplementary Matters of Embodiments

In the above embodiments, the configuration example of the CIS-based or CZTS-based solar cell has been described as an example of the photoelectric conversion element. However, the photoelectric conversion element of the present invention may be applied to, for example, a photodiode, an optical sensor, or the like as long as the photoelectric conversion layer contains a chalcogen semiconductor.

In addition, in the above embodiments, an example has been described in which the photoelectric conversion layer is removed by mechanical scribing, and the back electrode layer is removed by laser deletion. However, the method for removing the photoelectric conversion layer and the back electrode layer is not limited to the above. For example, the photoelectric conversion layer may be removed by laser deletion, and then the back electrode may be removed by etching.

In addition, in the above embodiment, the configuration example of the joined portion between the collector electrode and the interconnector has been described. However, the present invention can be similarly applied to the case of improving the adhesion strength of the joined portion between the collector electrode and the bypass diode.

Note that the configuration of the solar cell of the present invention is not limited to space applications, and can also be applied to, for example, when forming a joined portion that is less likely to break down even when receiving an external force due to strong wind, an earthquake, or the like in a solar cell installed on the ground.

As described above, the embodiments of the present invention have been described, but the embodiments are presented each as an example, and are not intended to limit the scope of the present invention. The embodiments can be implemented in various forms other than the above, and various omissions, substitutions, changes, and the like can be made without departing from the gist of the present invention. Embodiments and modifications thereof are included in the scope and gist of the present invention, and the invention described in the claims and equivalents thereof are also included in the scope and gist of the present invention.

REFERENCE SIGNS LIST

10, 10a to log solar cell
11 substrate
12 first region
13 second region
14 collector electrode
15 interconnector
17 bus bar electrode
19 conductive portion
21 first electrode layer
21a group VI compound layer
22 photoelectric conversion layer
24 second electrode layer
25 insulating layer
26 insulating film
27 hydrophilic layer

The invention claimed is:

1. A photoelectric conversion element comprising:
a back electrode layer formed on a substrate;
a photoelectric conversion layer facing a light receiving surface side of the back electrode layer and containing a chalcogen semiconductor;
a transparent electrode layer facing the light receiving surface side of the photoelectric conversion layer; and
a current collector electrically connected to the transparent electrode layer, wherein
a first region including an interface between the back electrode layer and the photoelectric conversion layer and a second region not including the interface between the back electrode layer and the photoelectric conversion layer are provided on the substrate,
the second region includes an insulating layer closer to the substrate side than the current collector,
the current collector and a wiring member overlap on the insulating layer in the second region;
a joined portion between the current collector and the wiring member is formed on the insulating layer in the second region, and
the transparent electrode layer is not disposed between the current collector and the insulating layer in the second region.

2. The photoelectric conversion element according to claim 1, wherein
in the second region, the insulating layer is formed on the substrate without interposing the back electrode layer.

3. The photoelectric conversion element according to claim 1, wherein
in the second region, the insulating layer is formed on the back electrode layer.

4. The photoelectric conversion element according to claim 1, wherein
the insulating layer covers an end surface of the photoelectric conversion layer in a planar direction.

5. The photoelectric conversion element according to claim 1, wherein
the insulating layer partially covers the first region above the light receiving surface side of the photoelectric conversion layer.

6. The photoelectric conversion element according to claim 1, wherein a material of the insulating layer includes at least one of Al$_2$O$_3$, Y$_2$O$_3$, ZrO$_2$, MgO, HfO$_2$, Bi$_2$O$_3$, TiO$_2$, ZnO, In$_2$O$_3$, SnO$_2$, Nb$_2$O$_5$, Ta$_2$O$_5$, SiO$_2$, and Ca$_3$(PO$_4$)$_2$.

7. The photoelectric conversion element according to claim 1, wherein a material of the current collector includes at least one of indium tin oxide, indium titanium oxide, indium zinc oxide, tin zinc doped indium oxide, tungsten doped indium oxide, hydrogen doped indium oxide, indium gallium zinc oxide, zinc tin oxide, fluorine doped tin oxide, aluminum doped zinc oxide, boron doped zinc oxide, gallium doped zinc oxide, Ni, Ti, Cr, Mo, Al, Ag, and Cu.

8. A method for manufacturing a photoelectric conversion element, the method comprising:

forming a back electrode layer on a substrate;

forming a photoelectric conversion layer containing a chalcogen semiconductor on a light receiving surface side of the back electrode layer;

forming a transparent electrode layer on the light receiving surface side of the photoelectric conversion layer;

partially removing the photoelectric conversion layer and the transparent electrode layer to form a first region including an interface between the back electrode layer and the photoelectric conversion layer and a second region not including the interface between the back electrode layer and the photoelectric conversion layer on the substrate;

forming an insulating layer in the second region; and forming, on the insulating layer in the second region, a joined portion between a current collector and a wiring member, the current collector being electrically connected to the transparent electrode layer;

wherein the second region includes the insulating layer closer to the substrate side than the current collector, the current collector and the wiring member overlap on the insulating layer in the second region, and the transparent electrode layer is not disposed between the current collector and the insulating layer in the second region.

9. The method for manufacturing a photoelectric conversion element according to claim 8, further comprising removing the back electrode layer in the second region after partially removing the photoelectric conversion layer and the transparent electrode layer.

10. A solar cell module comprising the photoelectric conversion element according to claim 1.

11. A paddle comprising a plurality of solar cell modules, wherein each solar cell module of the plurality of solar cell modules is the solar cell module according to claim 10 and the plurality of solar cell modules is connected so as to be deformable from a folded state or a rolled state to a flatly unfolded state.

* * * * *